(12) United States Patent
Kamachi et al.

(10) Patent No.: US 9,806,007 B2
(45) Date of Patent: Oct. 31, 2017

(54) SEMICONDUCTOR DEVICE MANUFACTURING METHOD

(71) Applicant: Renesas Electronics Corporation, Koutou-ku, Tokyo (JP)

(72) Inventors: Katsuhito Kamachi, Gunma (JP); Hideaki Tamimoto, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/368,640

(22) Filed: Dec. 4, 2016

(65) Prior Publication Data

US 2017/0221803 A1   Aug. 3, 2017

(30) Foreign Application Priority Data

Jan. 29, 2016  (JP) .................................. 2016-016104

(51) Int. Cl.
*H01L 21/00* (2006.01)
*H01L 23/495* (2006.01)
*H01L 21/48* (2006.01)
*H01L 23/00* (2006.01)

(52) U.S. Cl.
CPC .... *H01L 23/49555* (2013.01); *H01L 21/4842* (2013.01); *H01L 23/49513* (2013.01); *H01L 23/49562* (2013.01); *H01L 24/45* (2013.01); *H01L 24/48* (2013.01); *H01L 24/85* (2013.01); *H01L 2224/45124* (2013.01); *H01L 2224/4813* (2013.01); *H01L 2224/48247* (2013.01); *H01L 2224/73265* (2013.01); *H01L 2224/85205* (2013.01)

(58) Field of Classification Search
None
See application file for complete search history.

(56) References Cited

U.S. PATENT DOCUMENTS

| | | | |
|---|---|---|---|
| 8,378,467 B2 | 2/2013 | Fujioka et al. | |
| 8,609,468 B2* | 12/2013 | Fujisawa | H01L 21/565 257/666 |
| 2013/0009299 A1* | 1/2013 | Takada | H01L 23/49524 257/676 |

FOREIGN PATENT DOCUMENTS

| | | |
|---|---|---|
| JP | 2013-254801 A | 12/2013 |
| WO | WO 2011/030368 A1 | 3/2011 |

* cited by examiner

*Primary Examiner* — Angel Roman
(74) *Attorney, Agent, or Firm* — Shapiro, Gabor and Rosenberger, PLLC

(57) ABSTRACT

A semiconductor device manufacturing method which enhances the reliability of a semiconductor device. The method includes a step in which a source wire is connected with a semiconductor chip while jigs are pressed against a die pad. The jigs each have a first support portion with a first projection and a second support portion with a second projection. Using the jigs thus structured, the first projection is made to contact with a first point on the front surface of the die pad and then the second projection is made to contact with a second point on the front surface of the die pad located closer to a suspension lead than the first point.

20 Claims, 21 Drawing Sheets

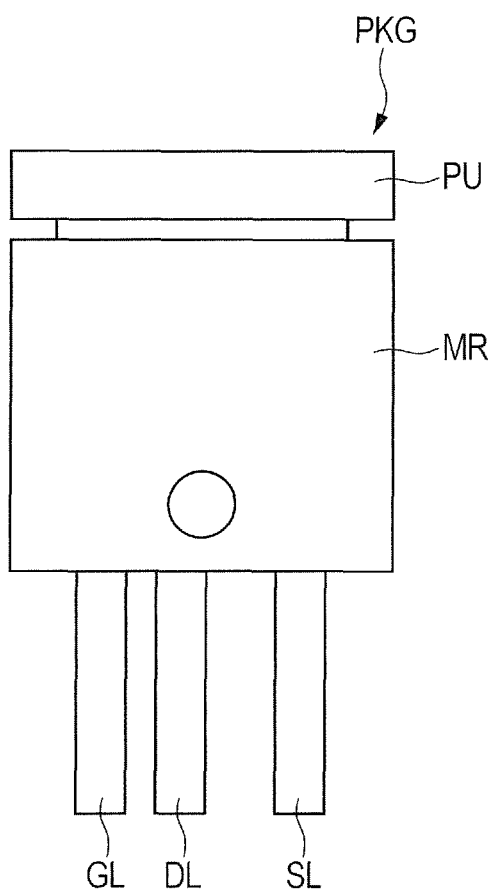
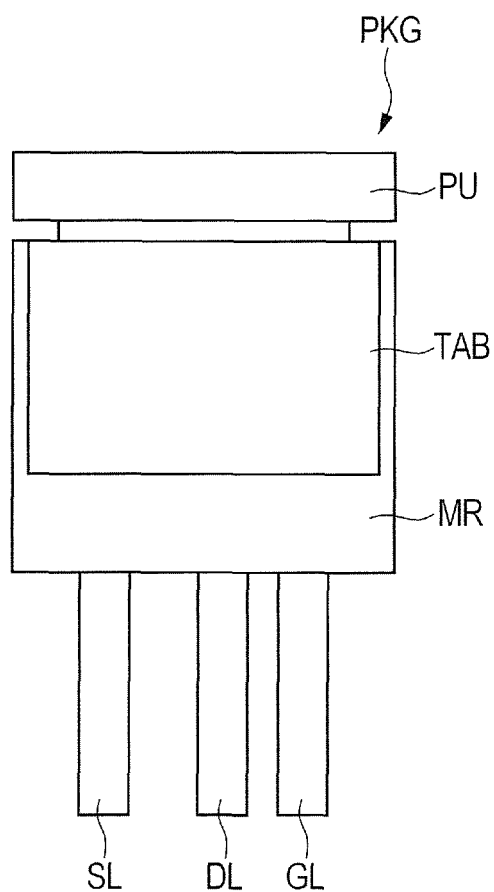

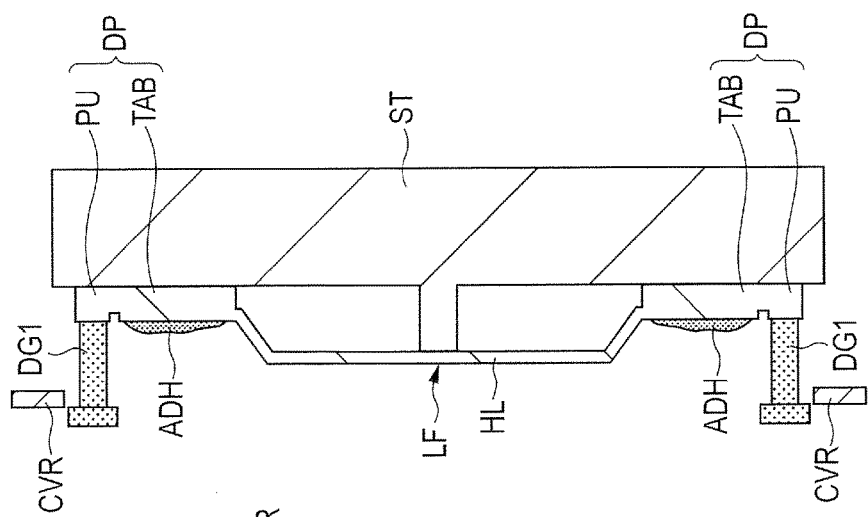
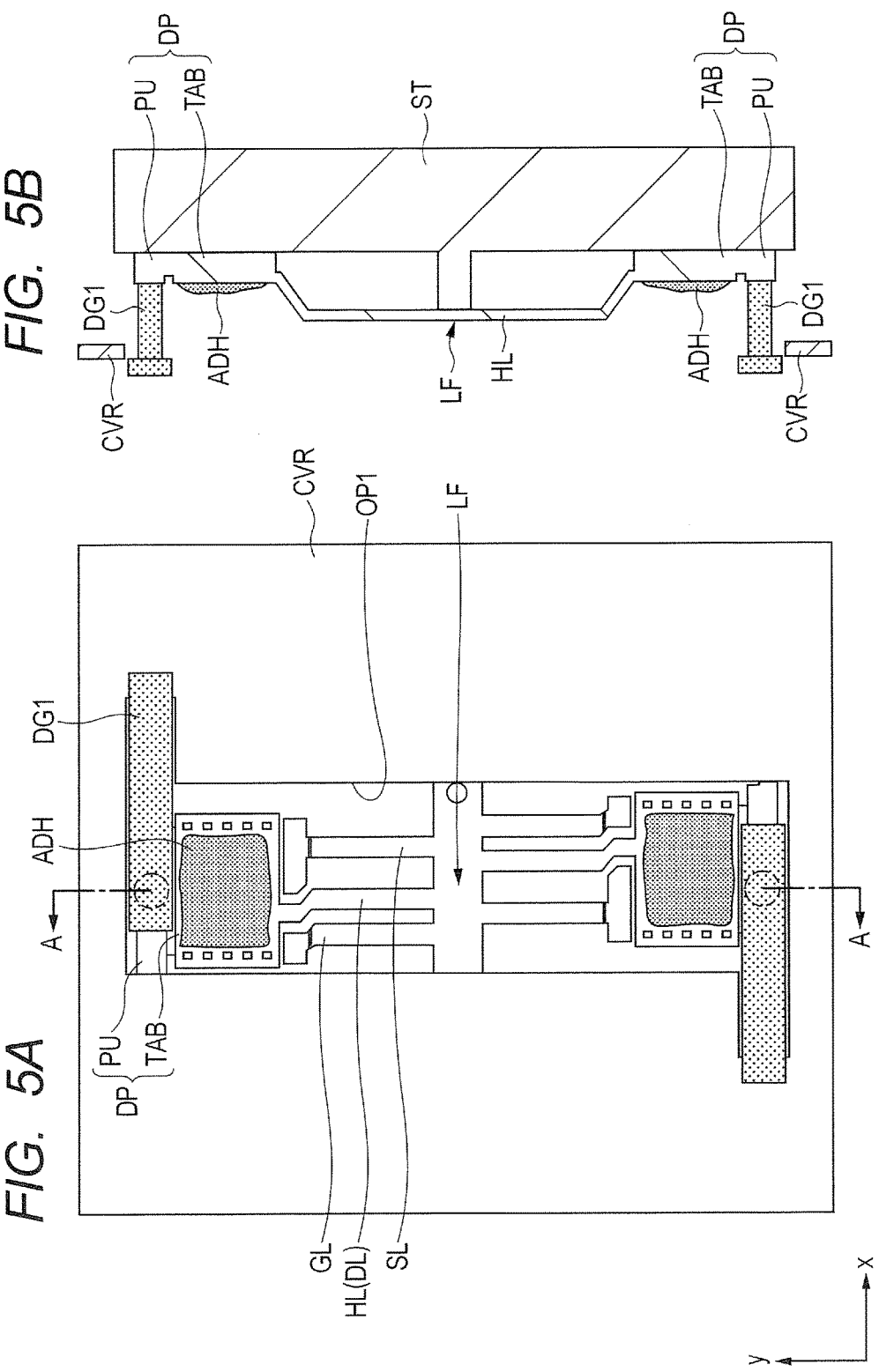

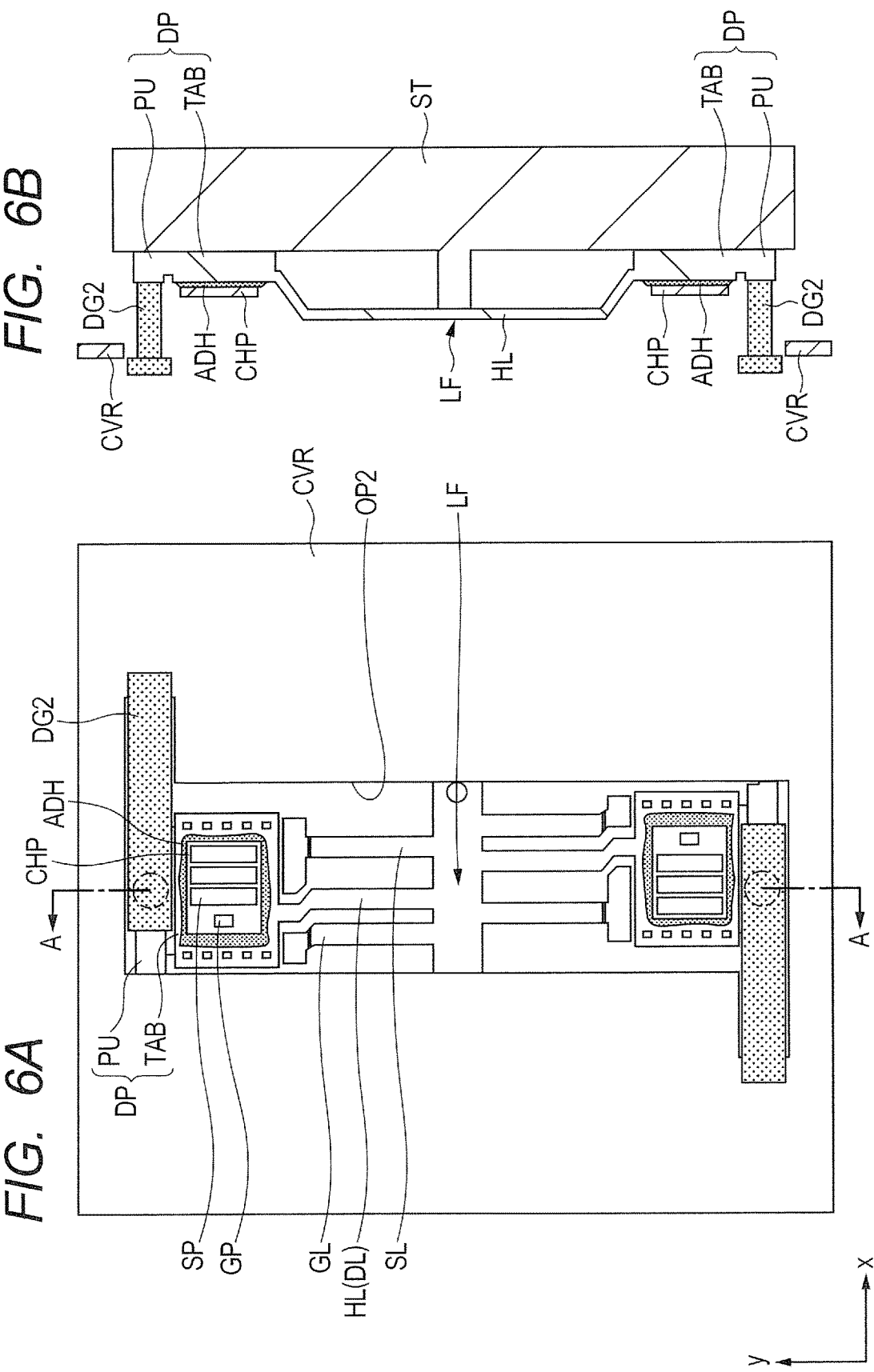

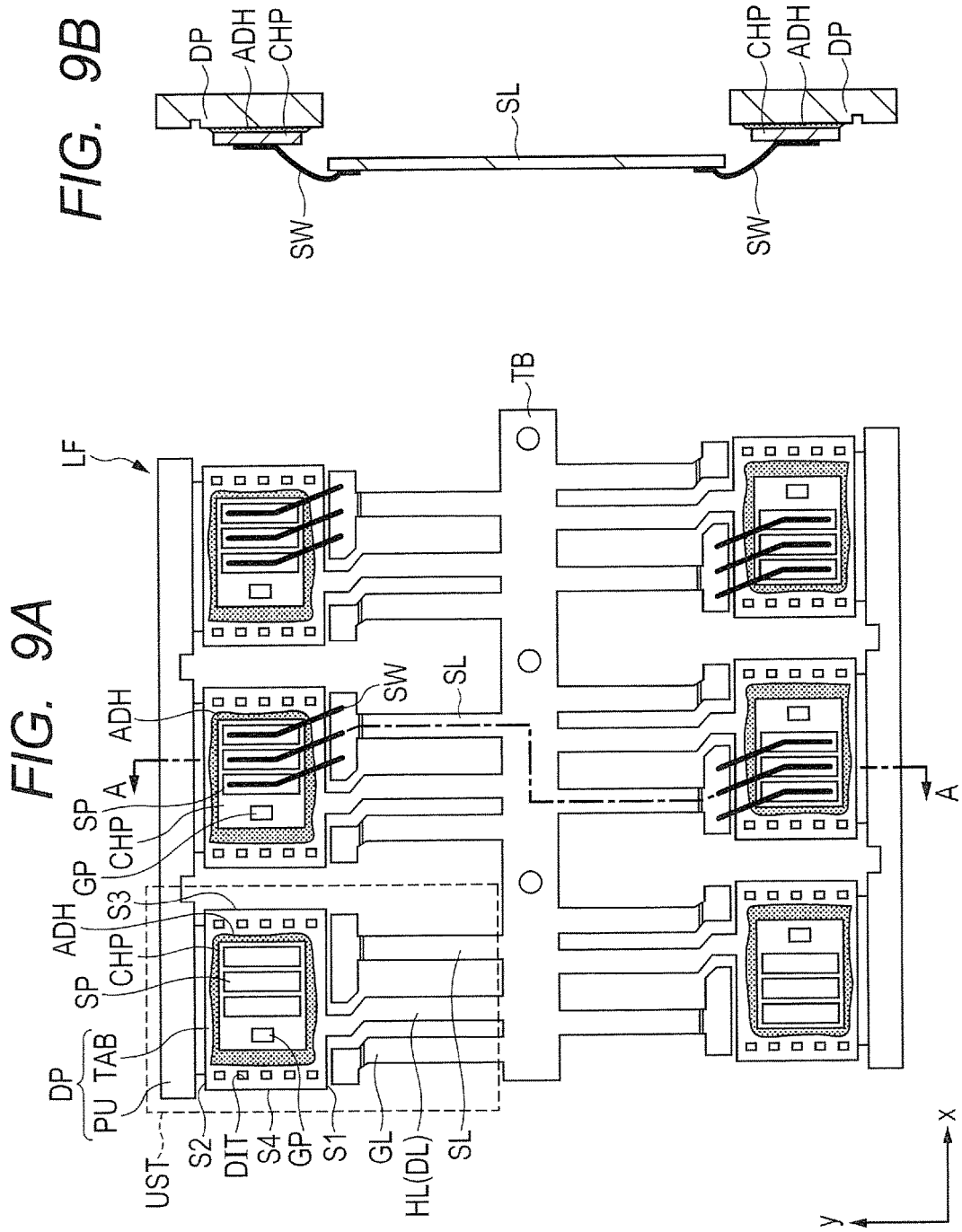

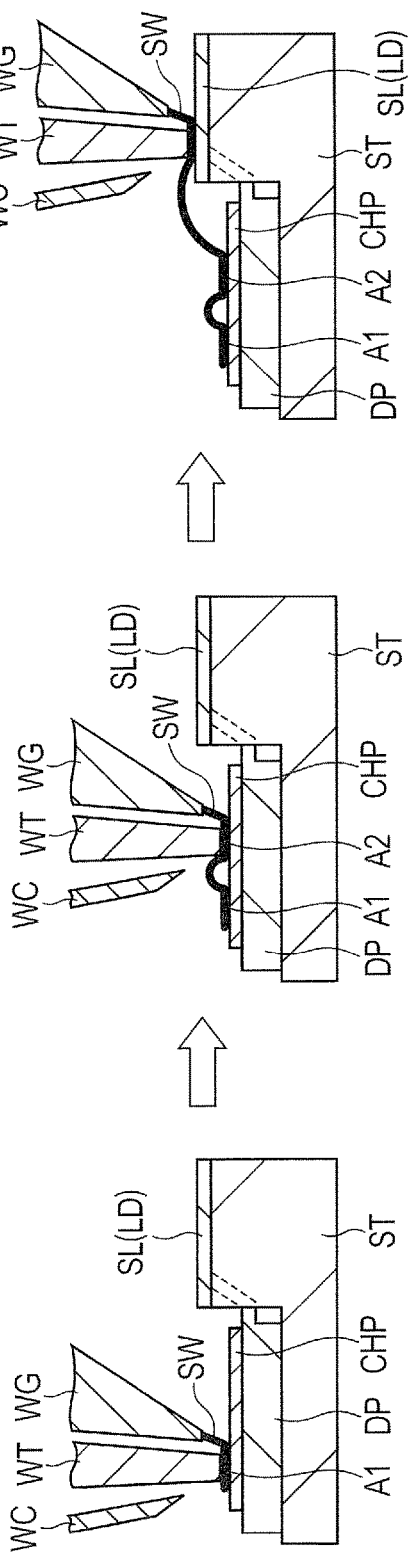

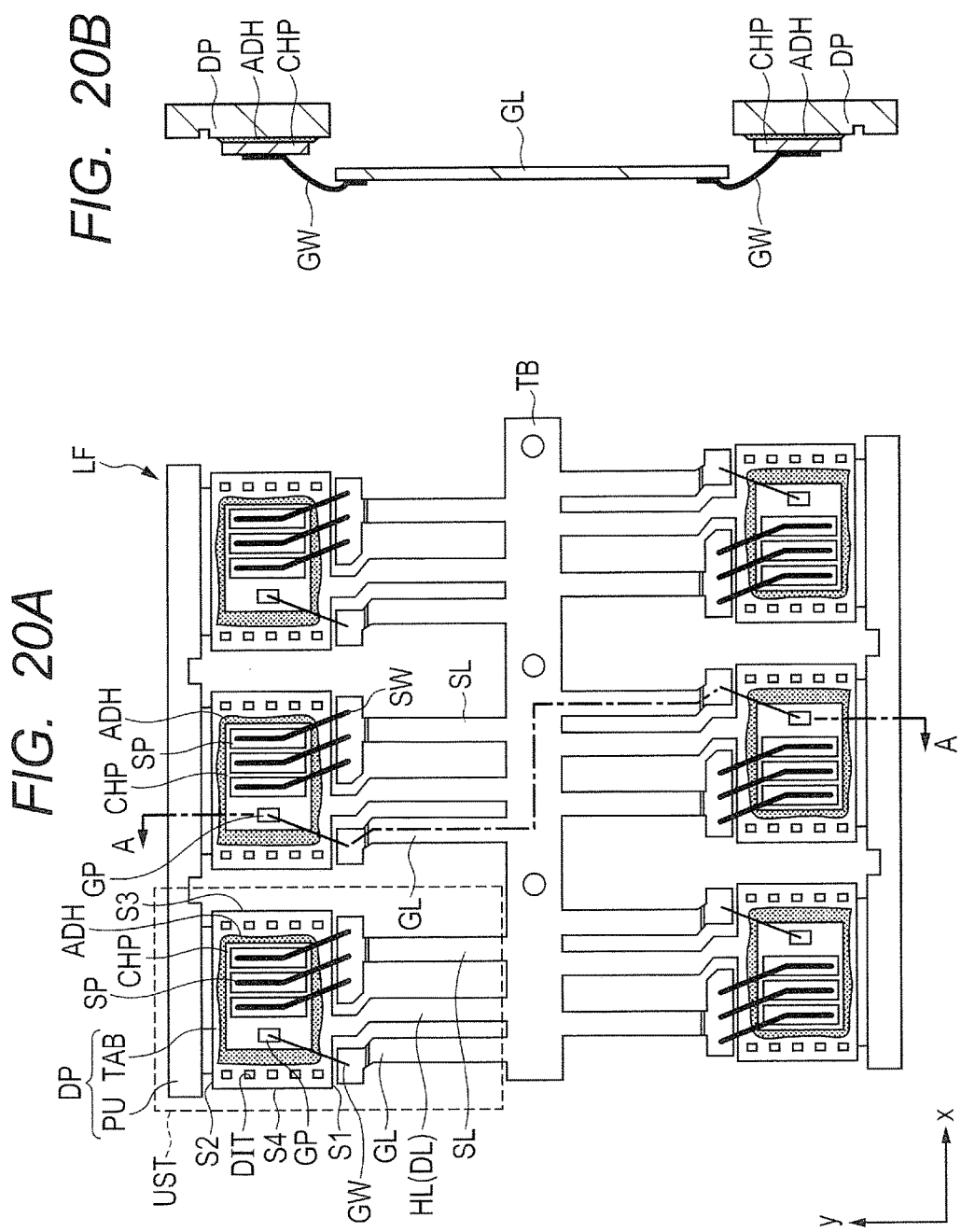

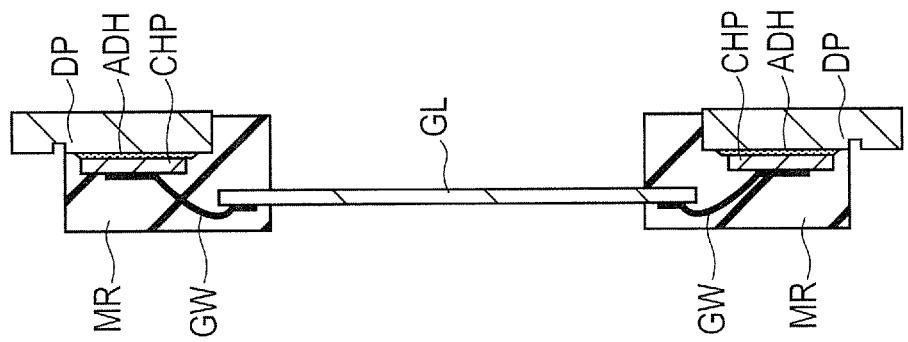
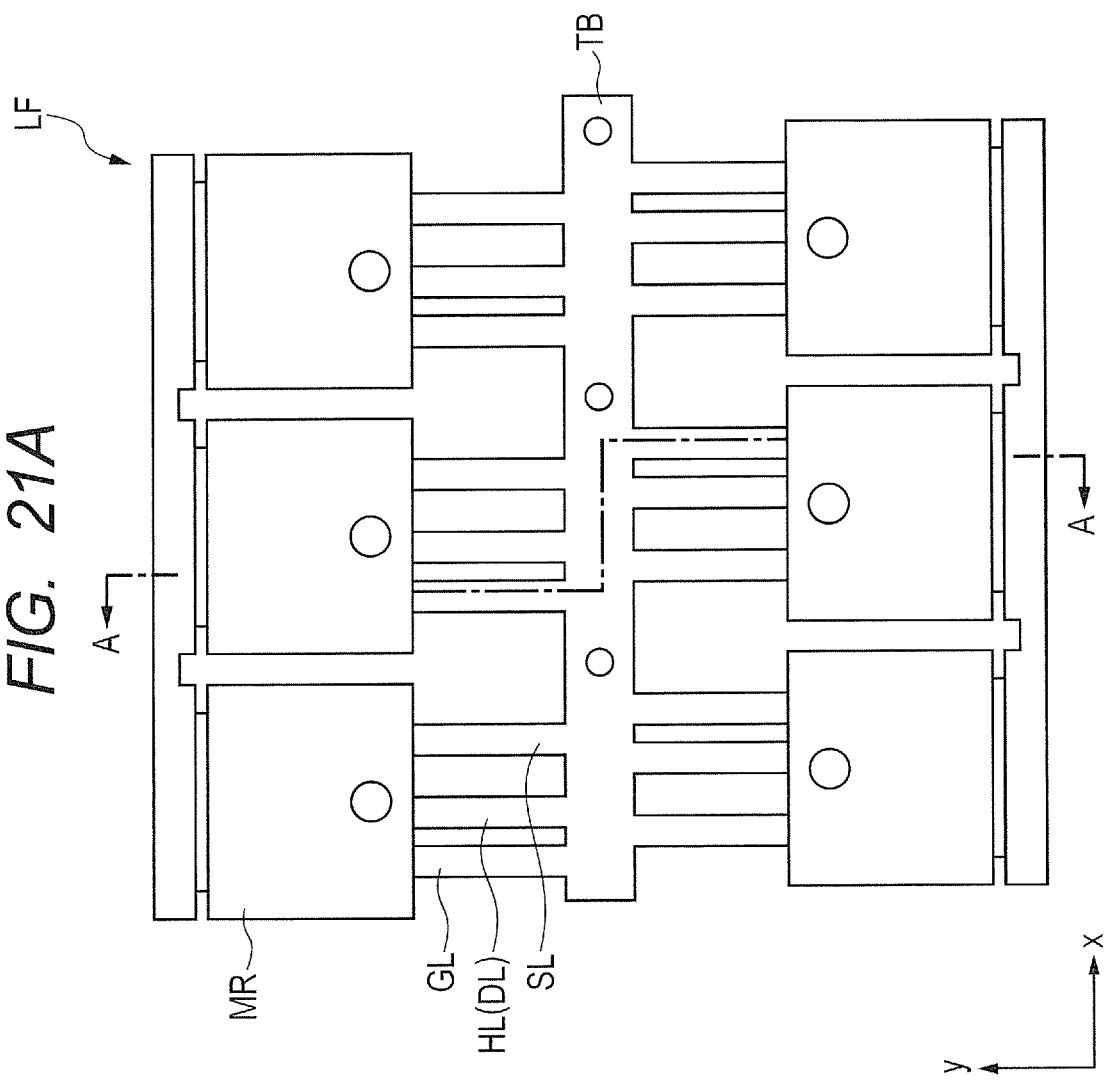

SEMICONDUCTOR DEVICE MANUFACTURING METHOD

CROSS-REFERENCE TO RELATED APPLICATIONS

The disclosure of Japanese Patent Application No. 2016-016104 filed on Jan. 29, 2016 including the specification, drawings and abstract is incorporated herein by reference in its entirety.

BACKGROUND

The present invention relates to semiconductor device manufacturing technology and more particularly to semiconductor device manufacturing technology which uses a jig for fixing a die pad.

WO 2011/030368 describes a technique which holds part of a die pad with a jig in the bonding step of connecting a conductive member with a semiconductor chip.

Japanese Unexamined Patent Application Publication No. 2013-254801 describes a technique which uses a jig having two pressing end surfaces to fix a lead frame in which a semiconductor chip is mounted.

SUMMARY

In the case of a lead frame in which bending has been done on the suspension lead for supporting a die pad as described in WO 2011/030368, the bending accuracy is likely to vary in the manufacturing process. Concretely, the die pad may be inclined with respect to the stage.

If a lead frame which includes such an inclined die pad and is highly rigid is used in the bonding step, the technique described in WO 2011/030368 may cause a decline in the strength of bonding between the conductive member and the semiconductor chip.

The above and further objects and novel features of the invention will more fully appear from the following detailed description in this specification and the accompanying drawings.

According to one aspect of the present invention, there is provided a semiconductor device manufacturing method which includes a step in which a conductive member is connected with a semiconductor chip while a jig is pressed against a die pad. The jig has a first support portion with a first convex part and a second support portion with a second convex part. Using the jig thus structured, the first convex part is made to contact with a first point on the first surface of the die pad and the second convex part is made to contact with a second point on the first surface of the die pad located closer to a suspension lead than the first point.

According to the present invention, the reliability in bonding between a conductive member and a semiconductor chip is enhanced, leading to enhancement of the reliability of the semiconductor device.

BRIEF DESCRIPTION OF THE DRAWINGS

FIG. 1A is a plan view as a top view of a semiconductor device as seen from above and FIG. 1B is a plan view as a bottom view of the semiconductor device as seen from below;

FIG. 5A is a plan view showing the semiconductor device manufacturing process according to the embodiment and FIG. 5B is a sectional view taken along the line A-A of FIG. 5A;

FIG. 6A is a plan view showing the semiconductor device manufacturing process according to the embodiment and FIG. 6B is a sectional view taken along the line A-A of FIG. 6A;

FIG. 9A is a plan view showing the semiconductor device manufacturing process according to the embodiment and FIG. 9B is a sectional view taken along the line A-A of FIG. 9A;

FIGS. 17A to 17E illustrate details of the wire bonding step according to the embodiment;

FIG. 20A is a plan view showing the semiconductor device manufacturing process according to the embodiment and FIG. 20B is a sectional view taken along the line A-A of FIG. 20A;

FIG. 21A is a plan view showing the semiconductor device manufacturing process according to the embodiment and FIG. 21B is a sectional view taken along the line A-A of FIG. 21A;

DETAILED DESCRIPTION

Figure 2:
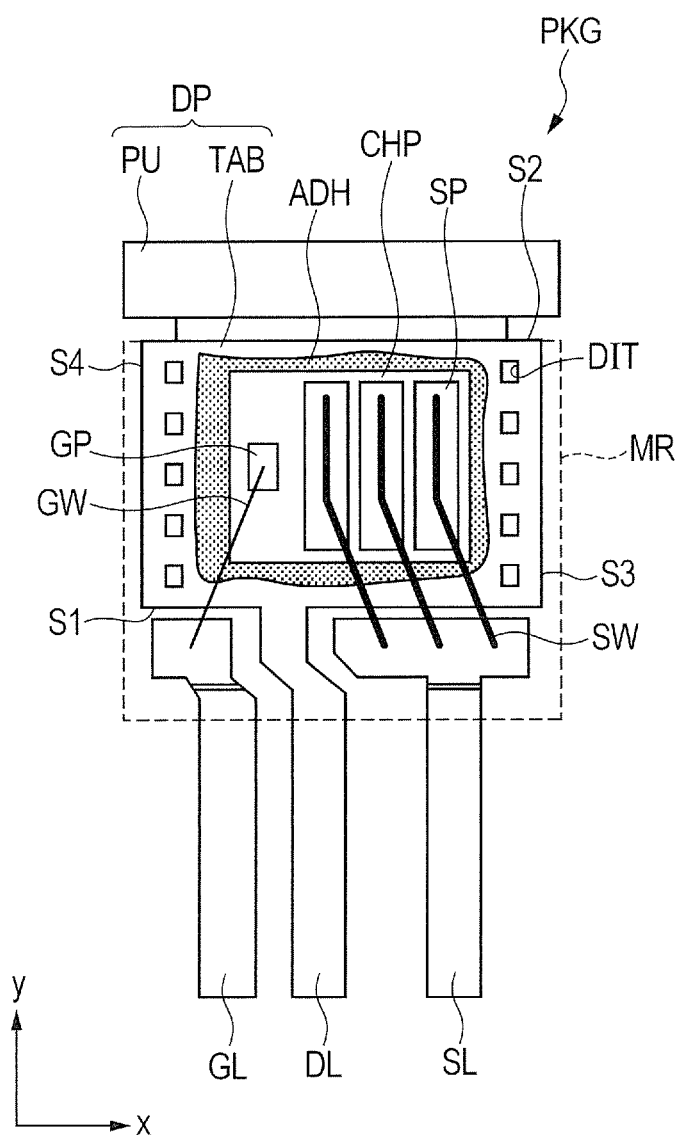
FIG. 2 is a transparent view showing the inside of the sealing body shown in FIG. 1A.

The preferred embodiments of the present invention may be described below in different sections or separately as necessary or for the sake of convenience, but the embodiments described as such are not irrelevant to each other unless otherwise stated. One embodiment may be, in whole or in part, a modified, detailed or supplementary form of another.

In the preferred embodiments described below, when numerical information for an element (the number of pieces, numerical value, quantity, range, etc.) is given by a specific number, it is not limited to the specific number unless otherwise stated or theoretically limited to the specific number; it may be larger or smaller than the specific number.

In the preferred embodiments described below, constituent elements (including constituent steps) are not necessarily essential unless otherwise stated or theoretically essential.

Similarly, in the preferred embodiments described below, when a specific form or positional relation is indicated for an element, it should be interpreted to include a form or positional relation which is substantially equivalent or similar to the specific form or positional relation unless otherwise stated or theoretically limited to the specific form or positional relation. The same is true for the above numerical values and ranges.

In all the drawings that illustrate an embodiment, basically, the same members are designated by the same reference signs and repeated descriptions thereof are omitted. For easy understanding, hatching may be used even in plan view.

Embodiment

<Glossary>

In this specification, the term "electronic component" means a component which uses electrons, and particularly a component which uses electrons in a semiconductor is called a "semiconductor component". One example of a "semiconductor component" is a semiconductor chip. Therefore, the term "semiconductor component" covers a "semiconductor chip", and when the "semiconductor component" is expressed in a more generic concept, it is an "electronic component".

In this specification, the term "semiconductor device" means a structure which has a semiconductor component and an external connecting terminal electrically connected with the semiconductor component. For example, it means a structure in which the semiconductor component is covered by a sealing body. Particularly, a "semiconductor device" is designed to be electrically connectable with an external device via an external connecting terminal.

In this specification, the term "power transistor" means an aggregate of unit transistors in which a plurality of unit transistors (cell transistors) are connected in parallel (for example, thousands to hundreds of thousands of unit transistors are connected in parallel) to perform the function as a unit transistor even at a current larger than the allowable current for a unit transistor. For example, if a unit transistor functions as a switching element, the "power transistor" serves as a switching element which can be used at a larger current than the allowable current for the unit transistor. Particularly in this specification, the term "power transistor" is used as a term in a more generic concept which covers, for example, both "power MOSFET" and "IGBT".

Furthermore, in this specification, the term "main constituent" means the constituent of the material of a member (layer, film, or wire) which is the largest in content among the constituents of the material of the member. For example, "wire mainly comprised of aluminum" means that in the material of the wire, aluminum (Al) is the highest in content. The purpose of using the term "main constituent" in this specification is to indicate that, for example, a wire is basically made of aluminum but it may contain other impurities.

<Semiconductor Device Structure>

First, the structure of a semiconductor device according to an embodiment of the present invention will be described. FIGS. 1A and 1B schematically show the external appearance of the semiconductor device PKG in this embodiment. FIG. 1A is a plan view as a top view of the semiconductor device PKG as seen from above and FIG. 1B is a plan view as a bottom view of the semiconductor device PKG as seen from below.

As shown in FIG. 1A, the semiconductor device PKG in this embodiment has a rectangular sealing body MR made of resin in which one side of the sealing body MR is connected with a tip portion PU. On the other hand, a source lead SL, a drain lead DL, and a gate lead GL protrude from the side of the sealing body MR which faces the side connected with the tip portion PU. Also, as shown in FIG. 1B, the back surface of a rectangular chip mounting area TAB is exposed from the back surface of the sealing body MR. This chip mounting area TAB and the tip portion PU are integrated.

FIG. 2 is a transparent view showing the inside of the sealing body MR shown in FIG. 1A. As shown in FIG. 2, the chip mounting area TAB is arranged inside the sealing body MR. The tip portion PU, located outside the sealing body MR, and the chip mounting area TAB are integrated and the tip portion PU and the chip mounting area TAB form a die pad DP.

More specifically, referring to FIG. 2, the chip mounting area TAB is rectangular and has a first side S1, a second side S2 opposite to the first side S1, a third side S3 crossing both the first side S1 and second side S2, and a fourth side S4 opposite to the third side S3. The chip mounting area TAB and the tip portion PU are connected on the second side S2 of the chip mounting area TAB. On the other hand, the chip mounting area TAB is connected with the drain lead DL on the first side S1 of the chip mounting area TAB. On the first side S1 of the chip mounting area TAB, the gate lead GL and source lead SL are spaced from the chip mounting area TAB and the drain lead DL is arranged between the gate lead GL and source lead SL. In the chip mounting area TAB, a plurality of ditches DIT are made along the third side S3 of the chip mounting area TAB and a plurality of ditches DIT are made along the fourth side S4 of the chip mounting area TAB.

Furthermore, as shown in FIG. 2, a semiconductor chip CHP (semiconductor component, electronic component) is mounted over the chip mounting area TAB, for example, via an adhesive ADH made of a solder material or silver paste. A power transistor is formed in the semiconductor chip CHP. Particularly, this embodiment assumes that a power MOSFET (Metal Oxide Semiconductor Field Effect Transistor) as a kind of power transistor is formed in the semiconductor chip CHP. As a consequence, as shown in FIG. 2, a source pad SP to be electrically connected with the source of the power MOSFET and a gate pad GP to be electrically connected with the gate electrode of the power MOSFET are formed on the front surface (upper surface) of the semiconductor chip CHP. As mentioned above, the semiconductor chip CHP in this embodiment has the main surface (front surface) and the back surface opposite to the main surface. The source pad SP (first main surface electrode) and the gate pad GP (second main surface electrode) smaller in external size than the source pad SP are formed on the main surface of the semiconductor chip CHP and on the other hand, a back surface electrode is formed on the back surface of the semiconductor chip CHP. Here, the plane area of the source pad SP is larger than the plane area of the gate pad GP.

The source pad SP is electrically connected with the source lead SL via a conductive member. The gate pad GP is electrically connected with the gate lead GL via a conductive member. The conductive member which connects the source pad SP and the source lead SL may be, for example, a wire (source wire SW) or ribbon. The conductive member which connects the gate pad GP and the gate lead GL may be, for example, a wire (gate wire GW). The diameter of the source wire SW is larger than the diameter of the gate wire GW. The reason is that whereas a large current flows in the source wire SW and its diameter must be increased to decrease the on-resistance, a smaller current flows in the gate wire GW than in the source wire SW and thus its diameter is smaller.

The source wire SW and gate wire GW maybe made of a material mainly comprised of aluminum; however, their material is not so limited and they may be made of a material mainly comprised of gold or copper. If the source pad SP and the source lead SL are connected by a ribbon, the ribbon is made of, for example, a material mainly comprised of aluminum.

The semiconductor device PKG in this embodiment is structured as mentioned above.

<Device Structure of the Power MOSFET>

Next, the device structure of the power MOSFET formed in the semiconductor chip CHP will be described referring to FIG. 3.

The power MOSFET formed in the semiconductor chip CHP includes thousands to hundreds of thousands of unit transistors (cell transistors) which are connected in parallel. Referring to FIG. 3, the device structure of the power MOSFET is described below, taking two unit transistors adjacent to each other as an example.

Figure 3:
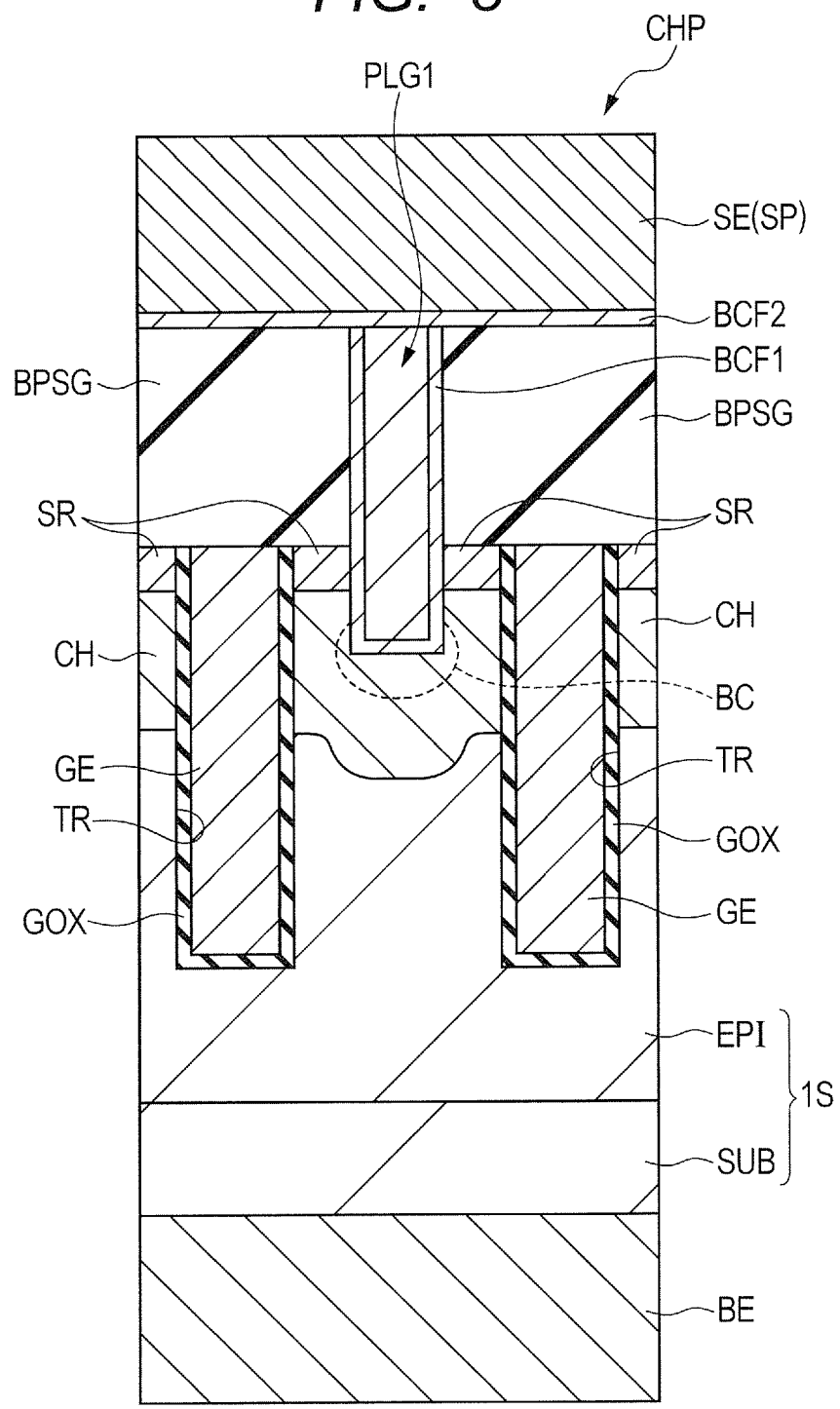
FIG. 3 is a sectional view showing an example of the device structure of a unit transistor formed in a cell formation region.

FIG. 3 is a sectional view showing an example of the device structure of a unit transistor formed in a cell formation region. As shown in FIG. 3, an epitaxial layer EPI is formed over a substrate layer SUB of silicon containing n-type impurities such as phosphor (P) or arsenic (As). The epitaxial layer EPI is a semiconductor layer mainly comprised of silicon containing n-type impurities such as phosphor (P) or arsenic (As). The substrate layer SUB and epitaxial layer EPI are constituent elements which function as a drain of the power MOSFET. In this embodiment, the substrate layer SUB and epitaxial layer EPI combined are called the semiconductor substrate 1S as shown in FIG. 3.

Then, an element area is formed on the front surface of the epitaxial layer EPI. Specifically, in the element area in this embodiment, a channel region CH is formed on the front surface of the epitaxial layer EPI and a trench TR which penetrates the channel region CH and reaches the epitaxial layer EPI is made. Agate insulating film GOX is formed on the inner wall of the trench TR and a gate electrode GE is formed over the gate insulating film GOX in a manner to fill the trench TR. The gate insulating film GOX is, for example, a silicon oxide film; however, instead it may be a high-permittivity film which is higher in permittivity than the silicon oxide film. The gate electrode GE may be, for example, made of polysilicon film.

Then, a source region SR is formed on the front surface of the channel region CH adjacent to the trench TR. Then, an insulating film BPSG is formed all over the upper surface of the trench TR in which the gate GE is buried, and the source region SR. The channel region CH is a semiconductor region doped with p-type impurities such as boron (B) and the source region SR is a semiconductor region doped with n-type impurities such as phosphor (P) or arsenic (As).

Then, a groove which penetrates the insulating film BPS and the source region SR and reaches the channel region CH is made between the adjacent trenches TR and a body contact region BC is formed at the bottom of the groove. The body contact region BC is a semiconductor region doped with p-type impurities such as boron (B) and the impurity concentration of the body contact region BC is higher than the impurity concentration of the channel region CH.

Then, a barrier conductor film BCF1 and a plug PLG1 made of tungsten film are formed in a manner to fill the groove with the body contact region BC formed at the bottom, and a barrier conductor film BCF2 and an aluminum alloy film (source electrode SE, source pad SP) are formed over the insulating film BPSG including the top of the plug PLG1. Consequently, the aluminum alloy film is electrically connected with the source region SR and also electrically connected with the channel region CH via the body contact region BC. In other words, the aluminum alloy film shown in FIG. 3 constitutes the source pad SP shown in FIG. 2.

Here, the body contact region BC has a function to ensure ohmic contact with the plug PLG1 and due to the existence of the body contact region BC, the source region SR and the channel region CH are electrically connected at the same potential.

Therefore, the turn-on of the parasitic NPN bipolar transistor, in which the source region SR is an emitter region, the channel region CH is a base region, and the epitaxial layer EPI is a collector region, can be suppressed. In other words, the fact that the source region SR and channel region CH are electrically connected at the same potential means that there is no difference in potential between the emitter region and base region of the parasitic NPN bipolar transistor, thereby suppressing the turn-on of the parasitic NPN bipolar transistor.

Then, as shown in FIG. 3, the back electrode BE is formed on the back surface of the substrate layer SUB.

The device structure of the power MOSFET is thus formed inside the semiconductor chip CHP in this embodiment.

In the power transistor formed inside the semiconductor chip CHP, the epitaxial layer EPI as an n-type semiconductor layer and the channel region CH as a p-type semiconductor layer form a body diode as a parasitic diode. In other words, a body diode as a PN diode is formed between the epitaxial layer EPI and the channel region CH in which the channel region CH is an anode and the epitaxial layer EPI is a cathode.

<<Variation>>

Although this embodiment has been described above, taking an example in which the power transistor formed in the semiconductor chip CHP is a power MOSFET, the technical idea of this embodiment is not limited thereto. For example, the technical idea can be applied to a semiconductor device including a semiconductor chip CHP in which an IGBT as another type of power transistor is formed.

<Semiconductor Device Manufacturing Method>

Next, the semiconductor device manufacturing method according to this embodiment will be described referring to drawings.

1. Step of Providing a Lead Frame

Figure 4B:
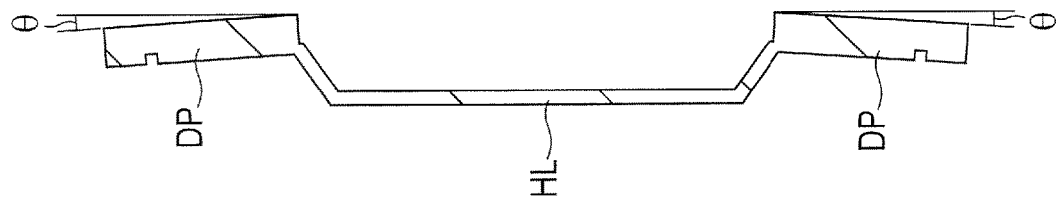
FIG. 4A is a plan view showing the semiconductor device manufacturing process according to an embodiment of the invention and FIG. 4B is a sectional view taken along the line A-A of FIG. 4A.
Figure 4A:
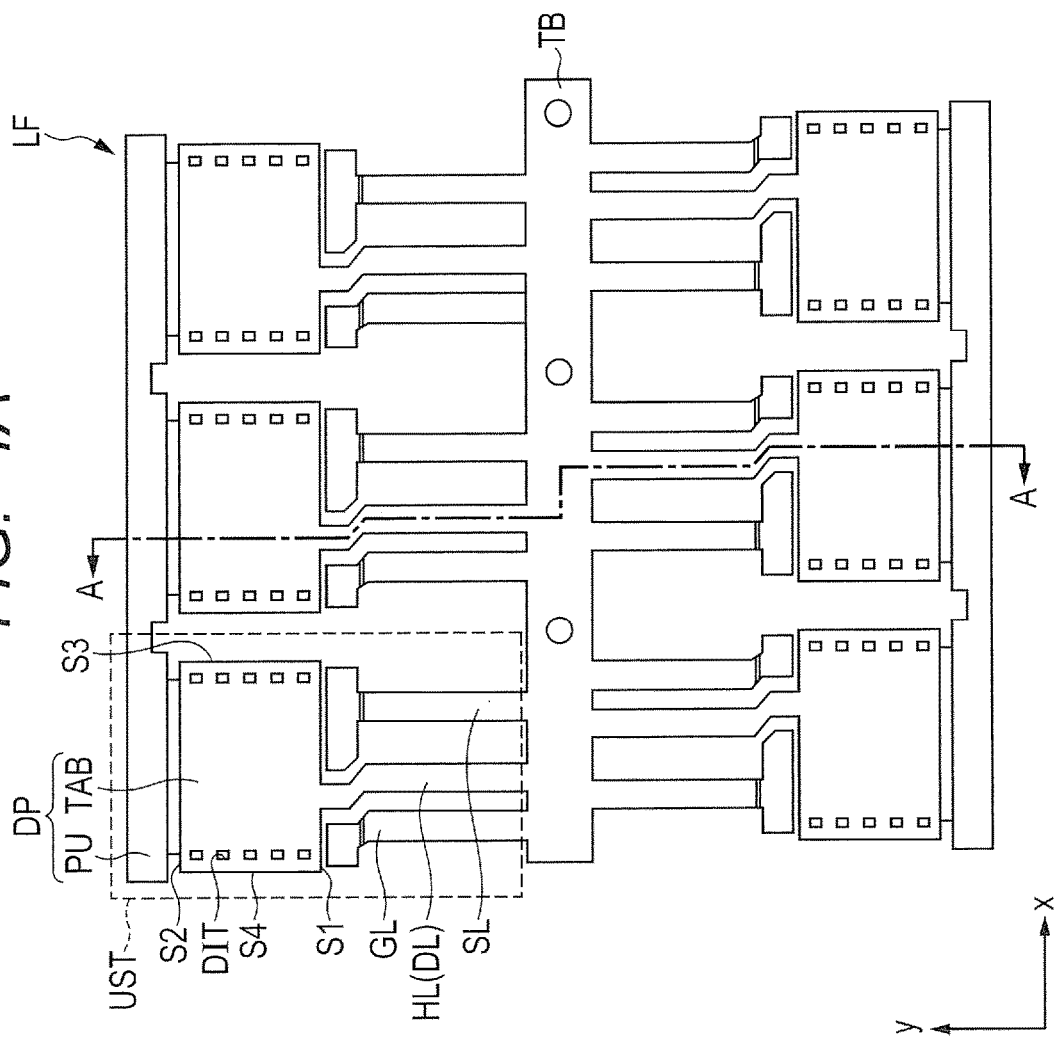

First, a lead frame LF having a plurality of unit structures UST is provided as shown in FIGS. 4A and 4B. The lead frame LF in this embodiment has six unit structures UST connected by a tie bar TB extending in the x direction in plan view as shown in FIG. 4A. Specifically, three unit structures UST are arranged side by side in the x direction above the tie bar TB (+y direction). Similarly, three unit structures UST are arranged side by side in the x direction below the tie bar TB (−y direction). However, the number of unit structures UST formed in the lead frame LF is not limited to six but it may be larger than six. As mentioned above, in the lead frame LF in this embodiment, some of the unit structures ST are arranged side by side in a first direction (x direction) crossing the direction in which a suspension lead HL extends (y direction).

Then, as shown in FIG. 4A, each of the unit structures UST has a die pad DP, a suspension lead HL for supporting the die pad DP, and a plurality of other leads (gate lead GL and source lead SL). Specifically, each of the unit structures UST has a plurality of leads, a die pad DP, and a suspension lead HL connected with the die pad DP and bent along the thickness direction of the die pad DP and after each unit structure UST is cut from the tie bar TB, the suspension lead HL becomes a drain lead DL.

Then, as shown in FIG. 4A, the die pad DP has a tip portion (header area) PU, a chip mounting area TAB over which a semiconductor chip is mounted in a later step, and a groove made between the tip portion PU and the chip mounting area TAB. The groove has a function to prevent the adhesive (die bonding agent) for use in the die bonding step (which will be described later) from spreading more than necessary, namely spreading beyond the chip mounting area TAB to the tip portion PU. In short, the groove is intended to suppress the possibility of the adhesive overflowing from the chip mounting area TAB to the tip portion PU.

As shown in FIG. 4A, the planar shape of the chip mounting area TAB is rectangular (quadrangular) and the first side S1 of the chip mounting area TAB is connected with the tie bar TB by the suspension lead HL. On the other hand, the tip portion PU is connected with the second side S2 of the chip mounting area TAB, facing to the first side S1, via the groove. The tip portion PU extends along the second side S2 of the chip mounting area TAB in plan view. The tip portions PU of the three unit structures UST arranged side by side in the x direction are mutually connected. In other words, the tip portions PU of the die pads DP in the unit structures UST arranged side by side in the x direction among a plurality of unit structures UST are integrated. As a consequence, the rigidity of the lead frame LF including a plurality of unit structures UST is increased.

In this embodiment, the die pad DP is inclined by angle θ(>0) with respect to the suspension lead HL and other leads (gate lead GL and source lead SL) extending in the y direction, as shown in FIG. 4B. Specifically, the front surface (back surface) of the die pad DP is not parallel to the surfaces of the suspension lead HL and the other leads (gate lead GL and source lead SL) but the die pad DP is inclined in a manner that the tip portion PU is in a more upward position than the joint of the chip mounting area TAB which is connected with the suspension lead HL. In other words, the die pad DP is inclined in a manner that the tip portion PU is closer to the leads (suspension lead HL, gate lead GL, source lead SL), in sectional view. From another viewpoint, it may be said that the front surface (back surface) of the die pad DP is not parallel to the surface of the tie bar TB but the die pad DP is inclined in a manner that the tip portion PU is in a more upward position than the joint of the chip mounting area TAB which is connected with the suspension lead HL. The lead frame LF is to be arranged over a stage, and when it is arranged over the stage, it may be considered that the die pad DP is inclined with respect to the lead frame mounting surface of the stage.

The reason that the die pad DP is thus inclined in this embodiment will be explained in the explanation of the die bonding step given below.

2. Die Bonding Step 2-1 Step of Supplying an Adhesive (Die Bonding Agent)

First, a lead frame is set in a die bonding apparatus (not shown), then an adhesive ADH of solder material or silver paste (die bonding agent) is coated on the chip mounting area TAB. Specifically, after the lead frame LF is conveyed such that the die pad DP to which the adhesive ADH is to be supplied is placed in the die bonding agent supply area of the die bonding apparatus, the adhesive ADH is coated on the chip mounting area TAB of the die pad DP exposed from an opening OP1 of a cover CVR as shown in FIGS. 5A and 5B. At this time, as shown in FIGS. 5A and 5B, the tip portion PU of the die pad DP exposed from the opening OP1 is pressed down with a jig DG1 to make the back surface of the inclined die pad DP (surface opposite to the chip mounting surface, exposed surface) contact with the stage ST. The inclination of the die pad DP exposed from the opening OP1 is thus eliminated. Then, with the lead frame LF pressed down by the jig DG1, the adhesive ADH is supplied onto the chip mounting area TAB of the die pad DP. Then, after the supplied adhesive ADH spreads over the chip mounting area TAB, the pressing force of the jig DG1 is released. Then, the lead frame LF is conveyed again such that the chip mounting area TAB coated with the adhesive ADH is placed in the chip supply area of the die bonding apparatus.

2-2 Chip Mounting Step

After that, as shown in FIGS. 6A and 6B, a semiconductor chip CHP is mounted over the front surface of the chip mounting area TAB supplied with the adhesive ADH. Specifically, as shown in FIGS. 6A and 6B, the lead frame is covered by the cover CVR and the die pad DP over which a chip is to be mounted is exposed from an opening OP2 in the cover CVR. The semiconductor chip CHP is mounted over the adhesive ADH supplied to the chip mounting area TAB of the exposed die pad DP. At this time, by pressing down the tip portion PU of the exposed die pad DP with the jig DG2, the back surface (surface opposite to the chip mounting surface, exposed surface) of the inclined die pad DP is made to contact with the stage ST. The inclination of the die pad DP exposed from the opening OP2 is thus eliminated. Then, with the lead frame LF pressed down with the jig DG2, the semiconductor chip CHP is mounted over the chip mounting area TAB coated with the adhesive ADH. The chip mounting step is performed in this way.

<<Variation>>

Although this embodiment has been described above on the assumption that the die bonding apparatus having a die bonding agent supply area and a chip supply area is used, instead a die bonding apparatus in which after supply of the adhesive ADH (die bonding agent) a semiconductor chip CHP is mounted in the same area may be used.

<<Reason That the Die Pad is Inclined>>

Next, why the die pad DP is inclined in this embodiment will be explained. For example, as shown in FIG. 4B, in the lead frame LF in this embodiment, the die pad DP is connected with the suspension lead HL bent along the die pad thickness direction. This means that bending is done on the lead frame LF in this embodiment. Therefore, depending on the bending accuracy, the die pad DP may be inclined. The die pad DP may be inclined not toward a single direction but in sectional view it maybe inclined toward the direction in which the tip portion PU becomes closer to the suspension lead HL or toward the direction in which the tip portion PU becomes remoter from the suspension lead HL. In this specification, inclination toward the direction in which the tip portion PU becomes closer to the suspension lead HL is called "forward inclination" and inclination toward the direction in which the tip portion PU becomes remoter from the suspension lead HL is called "reverse inclination". In other words, depending on the accuracy in bending of the lead frame LF, the die pad DP may be ideally not inclined or may be "forwardly inclined" or "reversely inclined". Particularly, if the die pad DP is reversely inclined, a problem may occur in the above die bonding step.

Figure 7A:
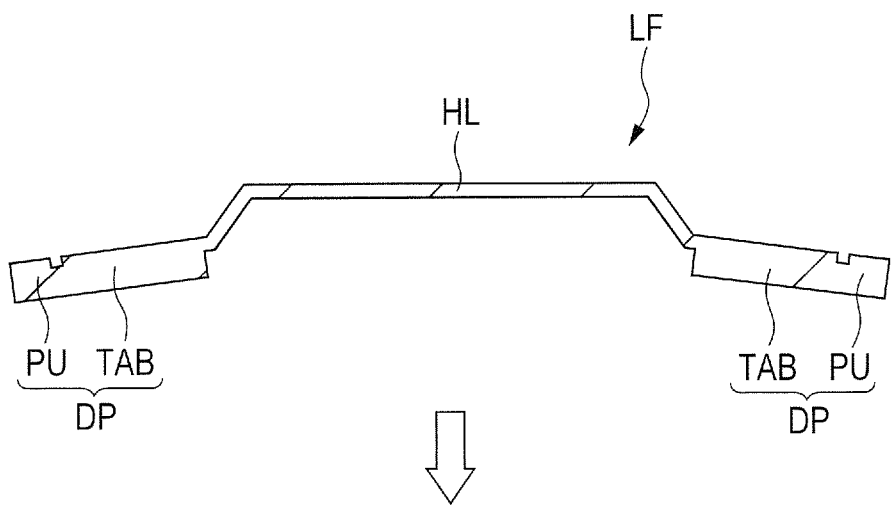
FIG. 7A is a sectional view showing that the die pad is "reversely inclined" and FIG. 7B shows that the tip portion of the "reversely inclined" die pad is pressed down with a jig during supply of an adhesive in the die bonding step.
Figure 7B:
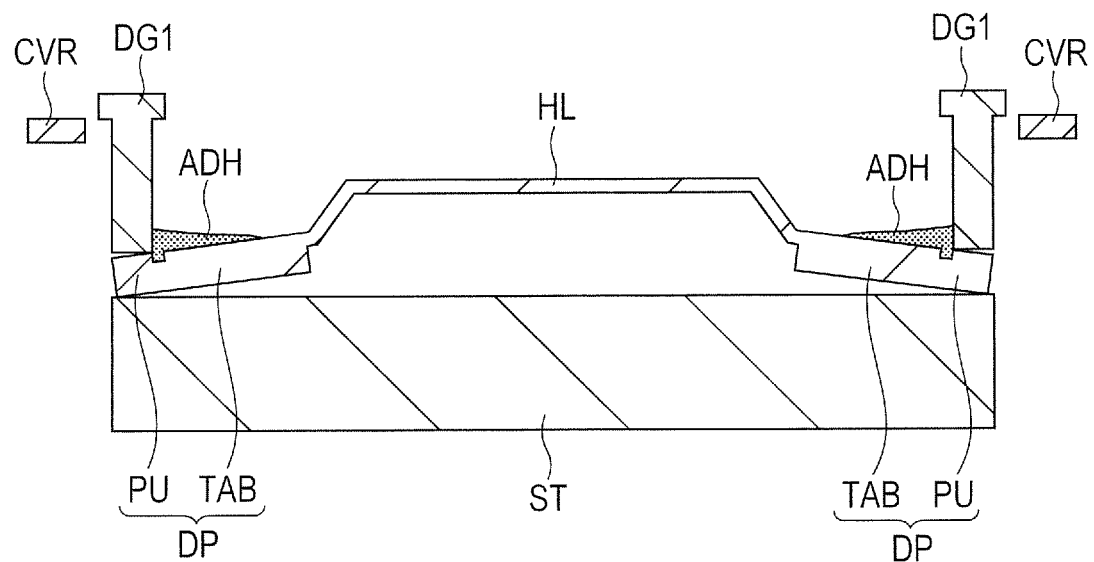

This problem is explained below. FIG. 7A is a sectional view showing that the die pad DP is "reversely inclined". FIG. 7B shows that the tip portion PU of the "reversely inclined" die pad DP is pressed down with the jig DG1, for example, during supply of the adhesive in the die bonding step. As shown in FIG. 7B, even when the tip portion PU of the "reversely inclined" die pad DP is pressed down with the jig DG1, the reverse inclination of the die pad DP is not eliminated. As a consequence, as shown in FIG. 7B, when the adhesive ADH in the form of paste is supplied onto the chip mounting area TAB of the "reversely inclined" die pad DP, the "reverse inclination" causes the paste adhesive ADH to flow toward the tip portion PU, making it difficult to supply the adhesive ADH onto the chip mounting area TAB uniformly. Consequently, a failure in bonding the semiconductor chip CHP to the chip mounting area TAB via the adhesive ADH may occur in the later chip mounting step.

One solution to this problem may be to press the jig DG1 not against the tip portion PU of the "reversely inclined" die pad DP but against the chip mounting area TAB of the die pad DP. However, as shown in FIGS. 5A and 5B and FIGS. 6A and 6B, the area of the lead frame LF except the die pad DP to be subject to die bonding is covered by the cover CVR. This is because in the die bonding step, the lead frame LF is heated via the stage ST and in order to make it easy to keep the temperature of the lead frame LF constant, the unrequired area or the area not to be subject to die bonding is covered by the cover CVR. Another reason that the unrequired area or the area not to be subject to die bonding is covered by the cover CVR is to suppress contact of the heated lead frame LF with the external air and prevent oxidation of the lead frame LF. Furthermore, although foaming gas is sent to the area not covered by the cover CVR in order to prevent oxidation of the die pad DP exposed from the opening OP1 (OP2) in the cover CVR, for the purpose of decreasing the use of foaming gas for cost reduction, the unrequired area or area which is not subject to die bonding is covered by the cover CVR. For these reasons, the cover is used in the die bonding step, but due to the presence of the cover it is difficult to press the jig DG1 (DG2) against the chip mounting area TAB of the die pad DP exposed from the cover CVR.

Therefore, in the die bonding step, as shown in FIGS. 5A and 5B and FIGS. 6A and 6B, the tip portion PU of the die pad DP exposed from the opening OP1 (OP2) in the cover CVR is pressed down with the jig DG1 (DG2). Therefore, the tip portion PU of the "reversely inclined" die pad DP is pressed down with the jig DG1. However, in this case, as shown in FIG. 7B, even when the tip portion PU of the die pad DP is pressed down with the jig DG1, the "reverse inclination" of the die pad DP is not eliminated. Consequently, as shown in FIG. 7B, when the adhesive ADH in the form of paste is supplied onto the chip mounting area TAB of the "reversely inclined" die pad DP, the "reverse inclination" causes the paste adhesive ADH to flow toward the tip portion PU, making it difficult to supply the adhesive ADH onto the chip mounting area TAB uniformly. Consequently, a failure in bonding the semiconductor chip CHP to the chip mounting area TAB via the adhesive ADH may occur in the later chip mounting step.

Figure 8A:
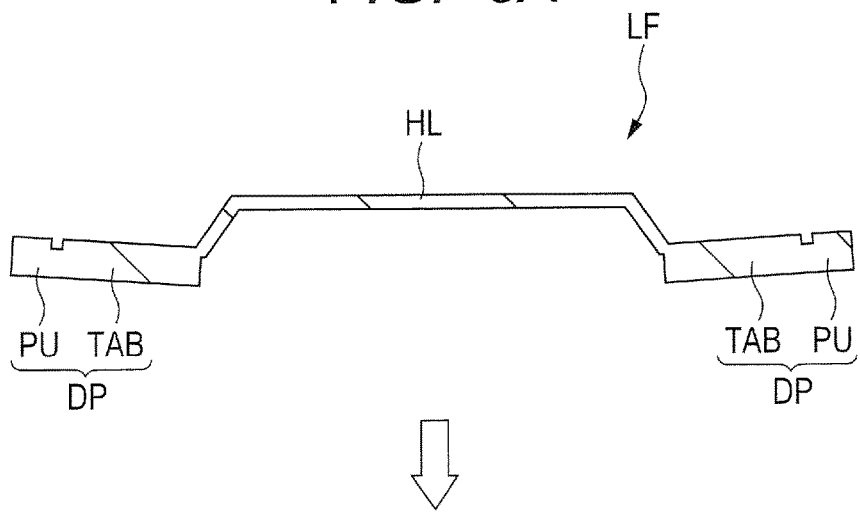
FIG. 8A is a sectional view showing that the die pad is "forwardly inclined" and FIG. 8B shows that the tip portion of the "forwardly inclined" die pad is pressed down with the jig during supply of the adhesive in the die bonding step.
Figure 8B:
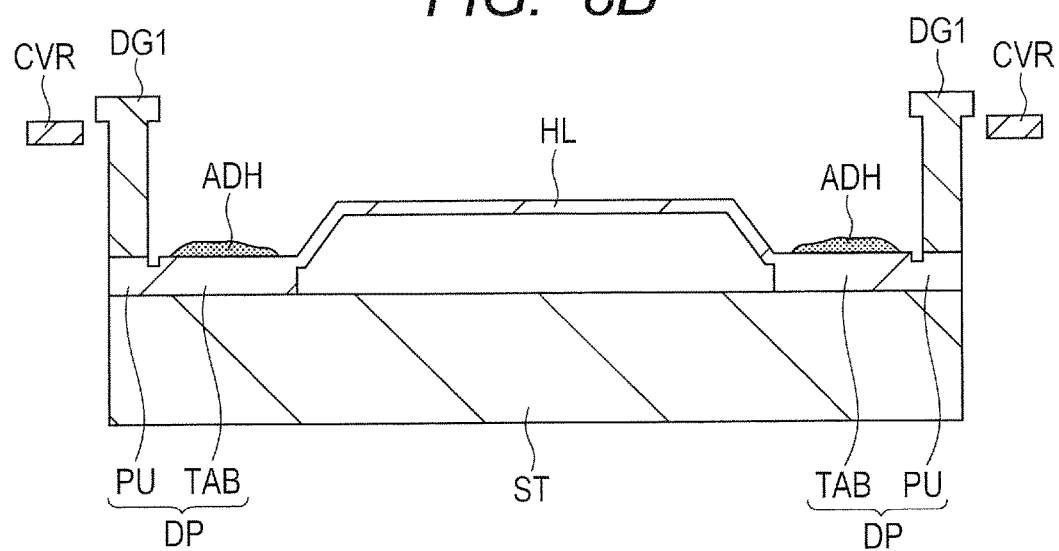

FIG. 8A is a sectional view showing that the die pad DP is "forwardly inclined". FIG. 8B shows that the tip portion PU of the "forwardly inclined" die pad DP is pressed down with the jig DG1, for example, during supply of the adhesive in the die bonding step. As shown in FIG. 8B, when the tip portion PU of the "forwardly inclined" die pad DP is pressed down with the jig DG1, the forward inclination of the die pad DP is eliminated and the horizontality of the die pad DP is ensured. Consequently the die pad DP is in tightly contact with the stage. Therefore, as shown in FIG. 8B, the paste adhesive ADH is supplied onto the chip mounting area TAB of the die pad DP which is no longer "forwardly inclined". Thus, as shown in FIG. 8B, the paste adhesive ADH does not flow to the tip portion PU and the adhesive ADH is supplied onto the chip mounting area TAB uniformly. This suppresses the possibility of a failure in bonding the semiconductor chip CHP to the chip mounting area TAB via the adhesive ADH in the later chip mounting step. In short, even if the die pad DP is "forwardly inclined", the problem which may occur when the die pad DP is "reversely inclined" does not occur. For this reason, in this embodiment, the die pads DP in all lead frames LF are purposely "forwardly inclined" in advance in order to prevent the "reverse inclination of the die pads DP caused by variation in the lead frame LF bending accuracy. This prevents the "reverse inclination of the die pad DP in the lead frame LF and thereby solves the above problem in the die bonding step. For the above reasons, the die pad DP is "forwardly inclined in this embodiment.

From the research by the present inventors, the present inventors have found that the problem in the die bonding step can be solved by "forwardly inclining" the die pad DP purposely and alsuch that there is room for improvement in the wire bonding step which will be described later. Therefore, in the explanation given below of the wire bonding step, the point to be improved, which the present inventors have newly found, will be first described and then an explanation will be given of details of the wire bonding step along with the technical idea of this embodiment which addresses the point to be improved.

3. Wire Bonding Step

First, as shown in FIGS. 9A and 9B, the source pad SP formed over the front surface (upper surface) of the semiconductor chip CHP and the source lead SL are electrically connected, for example, by a source wire SW mainly comprised of aluminum. However, the material of the source wire SW is not limited to a material mainly comprised of aluminum but it maybe a material mainly comprised of gold (Au) or copper (Cu). Alternatively, it may be a ribbon mainly comprised of aluminum.

Next, the wire bonding step will be explained in detail.

<<Point to Be Improved>>

The wire bonding step is performed with the die pad DP pressed against the stage with a jig. In the wire bonding step, for the purpose of increasing the bonding strength of the joint between the source pad SP and the source wire SW, it is desirable to press down the area nearest to the joint with the jig. Therefore, unlike the die bonding step in which the tip portion PU is pressed down with the jig DG1 (DG2) as shown in FIGS. 5A and 5B and FIGS. 6A and 6B, in the wire bonding step the jig may be pressed against the chip mounting area TAB over which the semiconductor chip CHP is mounted. The reason is as follows. In the die bonding step, the unrequired area in the lead frame LF, or the area which is not subject to die bonding, is covered by the cover CVR and due to the presence of the cover CVR it is impossible to press the jig DG1 (DG2) against the chip mounting area TAB. On the other hand, in the wire bonding step, the cover CVR is not used and thus due to the absence of the cover CVR it is possible to press the jig against the chip mounting area TAB over which the semiconductor chip CHP has been mounted.

Therefore, for the purpose of increasing the bonding strength of the joint between the source pad SP and the source wire SW, the wire bonding step is designed such that the area nearest to the joint is pressed down with the jig. However, in this case, if the jig in the related art is used and the die pad DP is "forwardly inclined", the die pad DP cannot be securely fixed, which may result in a bonding failure in the wire bonding step. In other words, there is room for improvement in the wire bonding step if the "forwardly inclined" die pad DP is pressed down using the jig in the related art.

Figure 10:
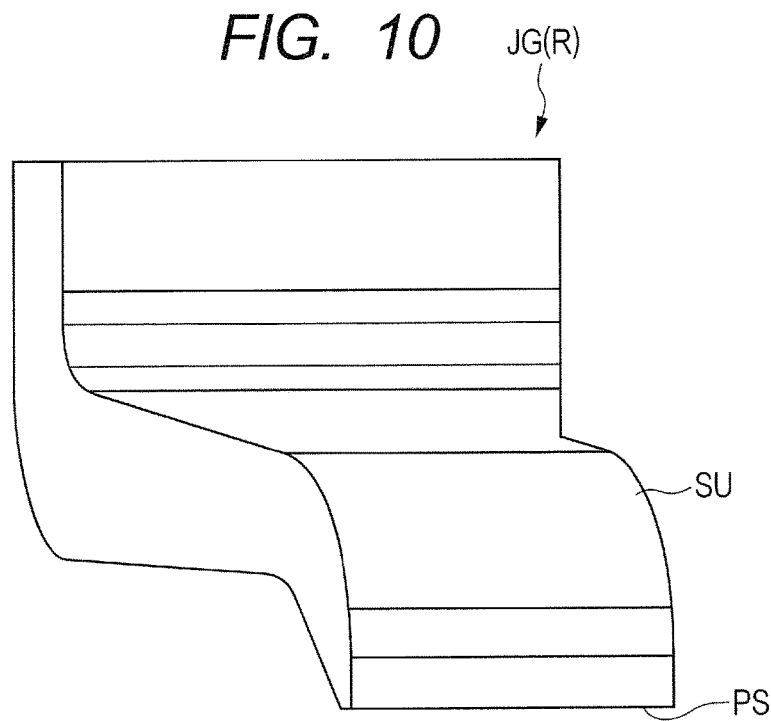
FIG. 10 is a schematic view showing a jig in the related art.

A concrete explanation is given below. FIG. 10 is an external view schematically showing a jig JD (R) in the related art. In this specification, the "related art" means the technique about which the present inventors have newly found a problem and it is not a known technique but the technique (technique not in the public domain) on which a novel technical idea is premised.

Figure 11:
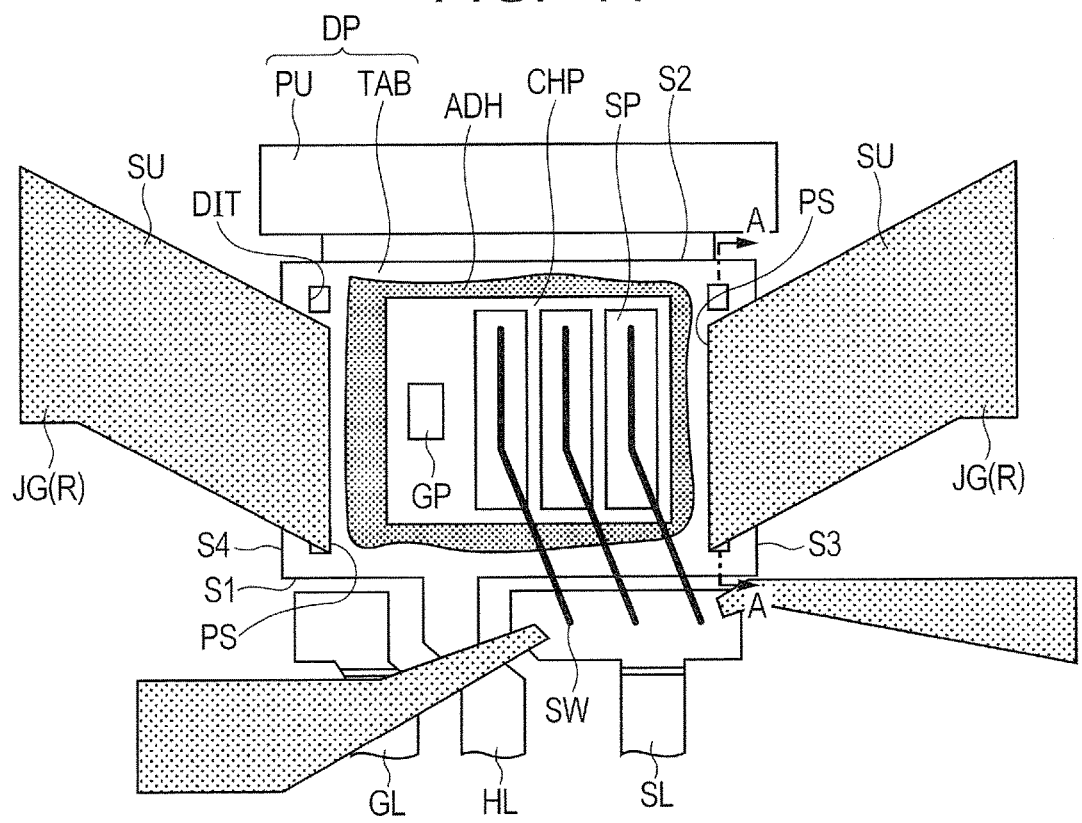
FIG. 11 schematically shows that the wire bonding step is performed with the two jigs shown in FIG. 10 pressed against the chip mounting area.

As shown FIG. 10, the jig in the related art JG (R) has a support portion SU connected with a main body and the tip PS of the support portion SU is a flat surface. FIG. 11 schematically shows that the wire bonding step is performed with two jigs JG (R) (as shown in FIG. 10) pressed against the chip mounting area TAB. More specifically, the tip PS of one jig JG (R) is pressed against the third side S3 of the chip mounting area TAB and the other jig JG (R) is pressed against the fourth side S4 of the chip mounting area TAB.

Figure 12:
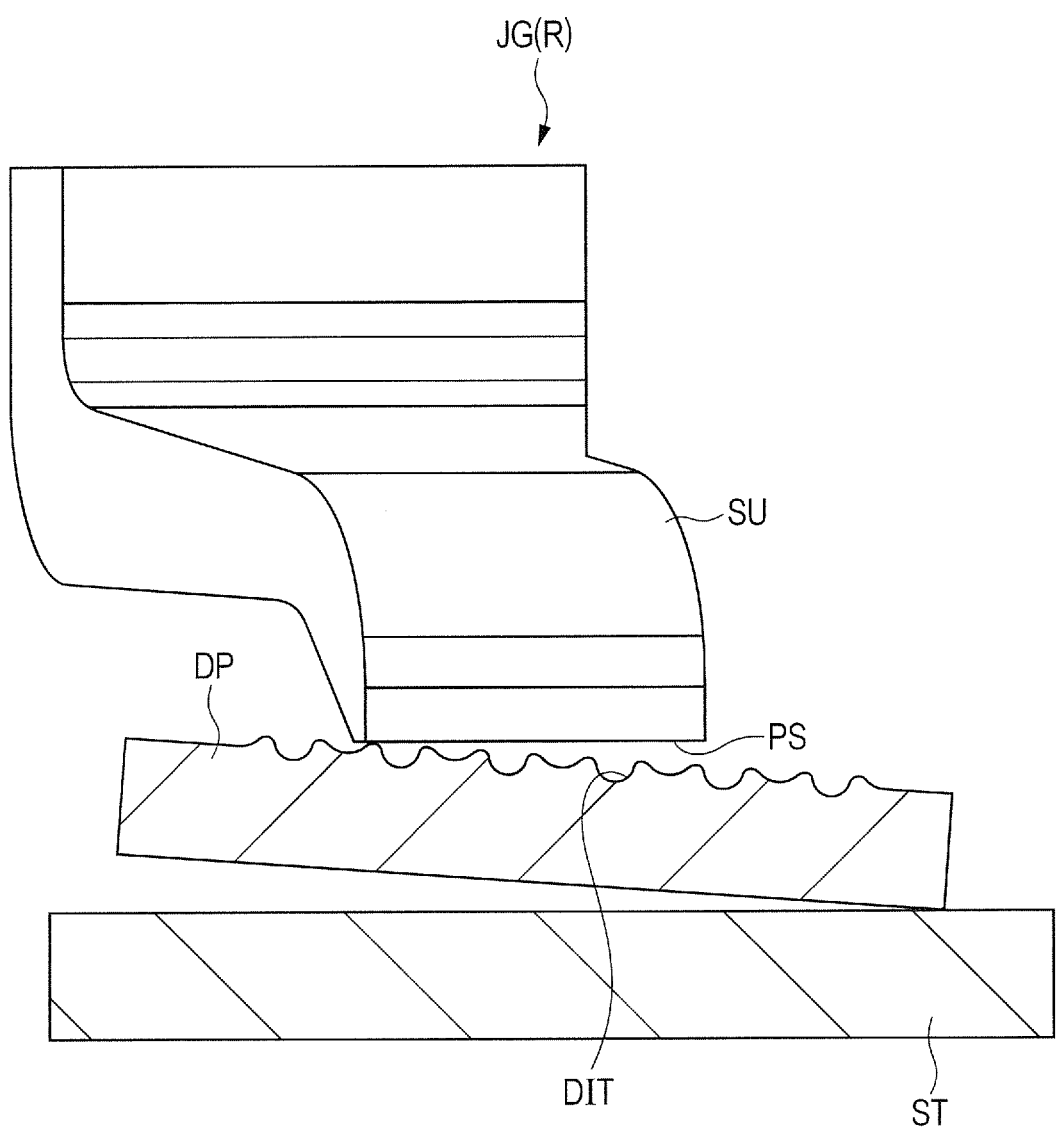
FIG. 12 is a schematic view taken along the line A-A of FIG. 11.

FIG. 12 is a schematic view taken along the line A-A of FIG. 11. As shown in FIG. 12, in this embodiment, the die pad DP is "forwardly inclined" and the tip PS of the jig JG (R) is pressed against the "forwardly inclined" die pad DP. In this case, as shown in FIG. 12, since the die pad DP is "forwardly inclined" and the tip PS of the jig JG (R) is a flat surface, only one side or part of the tip PS of the jig JG (R) is made to contact with the die pad DP. As a consequence, it is difficult for the jig in the related art JG (R) to eliminate the inclination of the "forwardly inclined" die pad DP and fix the die pad DP on the stage ST securely. When only one side of the jig JG (R) is made to contact with the die pad DP, a sufficient weight cannot be applied to the die pad DP. In addition, since the tip portions PU of the die pads DP in the unit structures UST arranged side by side in the x direction are integrated as shown in FIG. 4, the rigidity of the die pad DP is high and thus it is difficult to deform the "forwardly inclined" die pad DP using the jig JG (R) which is made to contact with the die pad DP only partially or on one side.

For the above reason, it is difficult to fix the "forwardly inclined" die pad DP on the stage ST securely using the jig in the related art JG (R). In this case, in the wire bonding step, the die pad DP is unstably fixed, resulting in a decline in the reliability of the joint between the source pad SP and the source wire SW. For example, if ultrasonic waves are applied to the area of contact between the source pad SP and the source wire SW in the wire bonding step in order to increase the bonding strength, ultrasonic waves may disperse and a bonding failure as typified by wire peeling is likely to occur because the die pad DP is not securely fixed on the stage ST. In sum, when the jig in the related art JG (R) is used, unstableness of the die pad DP as a direct factor and dispersion of ultrasonic waves caused by the unstableness of the die pad DP as an indirect factor are combined synergistically and a bonding failure as typified by wire peeling may occur.

In this embodiment, a new approach to preventing a bonding failure as typified by wire peeling which occurs in the wire bonding step is adopted. Concretely, the shape of the jig for pressing down the chip mounting area TAB in the wire bonding step is changed so as to prevent a bonding failure as typified by wire peeling. Next, the technical idea of the new approach adopted in this embodiment will be described referring to drawings.

<<Features of the Embodiment>>
(A) Structure of the Jig

Figure 13:
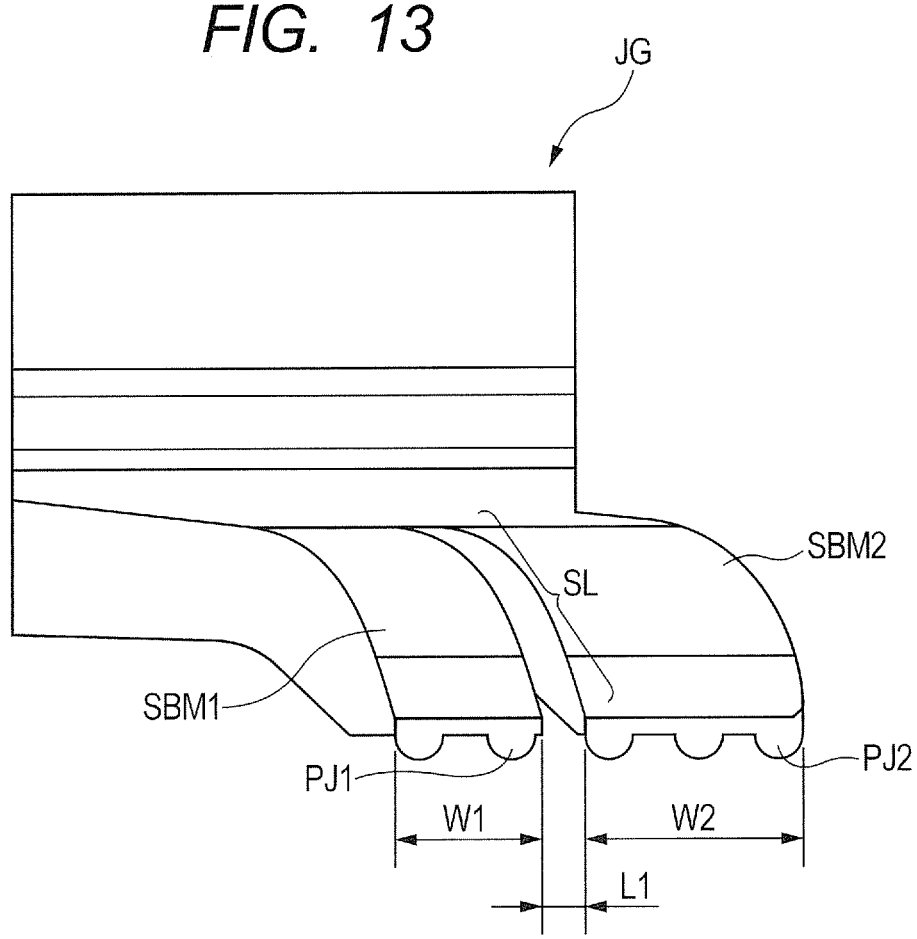
FIG. 13 schematically shows the structure of the jig according to the embodiment.

FIG. 13 schematically shows the structure of the jig (clamper) JG in this embodiment. As shown in FIG. 13, the jig JG according to this embodiment has an elastically deformable support portion SBM1 and an elastically deformable support portion SBM2 which are branched from a main body and separated from each other. A projection (convex part) PJ1 is provided at the tip of the support portion SBM1 and a projection (convex part) PJ2 is provided at the tip of the support portion SBM2.

In this embodiment, the jig JG fixes a die pad placed on the stage. More specifically, the jig JG according to this embodiment includes: an elastically deformable support portion SBM1; a support portion SBM2 which is separated from the support portion SBM1 by a slit SL and elastically deformable; a projection PJ1 which is provided on the support portion SBM1 and can make contact with the die pad; and a projection PJ2 which is provided on the support portion SBM2 and can make contact with the die pad.

The length of the slit SL is larger than width L1 as the distance between the support portion SBM1 and the support portion SBM2. Specifically, the jig JG according to this embodiment has a slit SL which separates the support portion SBM1 and the support portion SBM2, in which the length of the slit SL is larger than the width as the distance between the support portion SBM1 and the support portion SBM2 in the direction crossing the slit SL. Consequently, the support portion SBM1 and the support portion SBM2 can be elastically deformed easily.

Furthermore, as shown in FIG. 13, the size (diameter) of the projection PJ1 is smaller than the width W1 of the support portion SBM1 and the size (diameter) of the projection PJ2 is smaller than the width W2 of the support portion SBM2. In the jig JG according to this embodiment, the small projection PJ1 can make contact with the die pad and the small projection PJ2 can make contact with the die pad. Therefore, in this embodiment, the pressing force applied to the die pad by the jig JG can be increased. In the jig JG according to this embodiment, the width W1 of the support portion SBM1 is smaller than the width W2 of the support portion SBM2. This means that the support portion SBM1 warps more easily than the support portion SBM2. However, the structure of the jig JG according to this embodiment is not limited to the above; instead, for example, the width W1 of the support portion SBM1 may be equal to the width W2 of the support portion SBM2. In this case, the pressing force applied to the die pad by the support portion SBM1 is equal to the pressing force applied to the die pad by the support portion SBM2.

(B) Fixing the Die Pad Using the Jig

Figure 14:
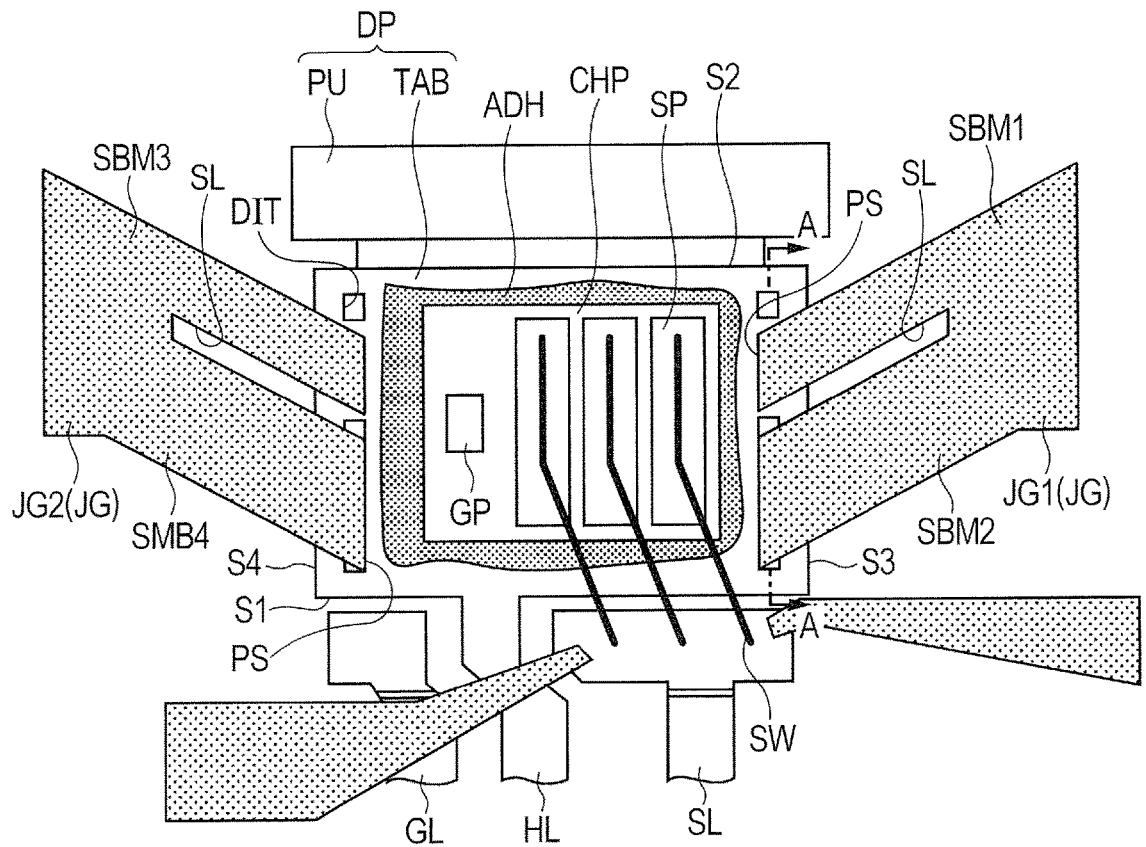
FIG. 14 shows that the jig according to the embodiment as shown in FIG. 13 is pressed against the chip mounting area of the die pad.

FIG. 14 shows that the jig JG according to this embodiment as shown in FIG. 13 is pressed against the chip mounting area TAB of the die pad DP. As shown in FIG. 14, two jigs JG according to this embodiment are used in the wire bonding step. Specifically, one jig JG1 is arranged along the third side S3 of the chip mounting area TAB and the other jig JG2 is arranged along the fourth side S4 of the chip mounting area TAB. More specifically, concerning the jig JG1, the jig JG1 is arranged over the chip mounting area TAB such that the support portion SBM1 of the jig JG1 is close to the second side S2 of the chip mounting area TAB and the support portion SBM2 of the jig JG1 is close to the first side S1 of the chip mounting area TAB. Similarly, concerning the jig JG2, the jig JG2 is arranged over the chip mounting area TAB such that the support portion SBM3 of the jig JG2 is close to the second side S2 of the chip mounting area TAB and the support portion SBM4 of the jig JG2 is close to the first side S1 of the chip mounting area TAB. Thus, in this embodiment, the jig JG1 is pressed against the chip mounting area TAB of the die pad DP from right and the jig JG2 is pressed against the chip mounting area TAB of the die pad DP from left. Consequently, the chip mounting area TAB is fixed by the jig JG1 and the jig JG2 such that the semiconductor chip CHP mounted over the chip mounting area TAB is sandwiched in plan view as shown in FIG. 14.

Figure 15:
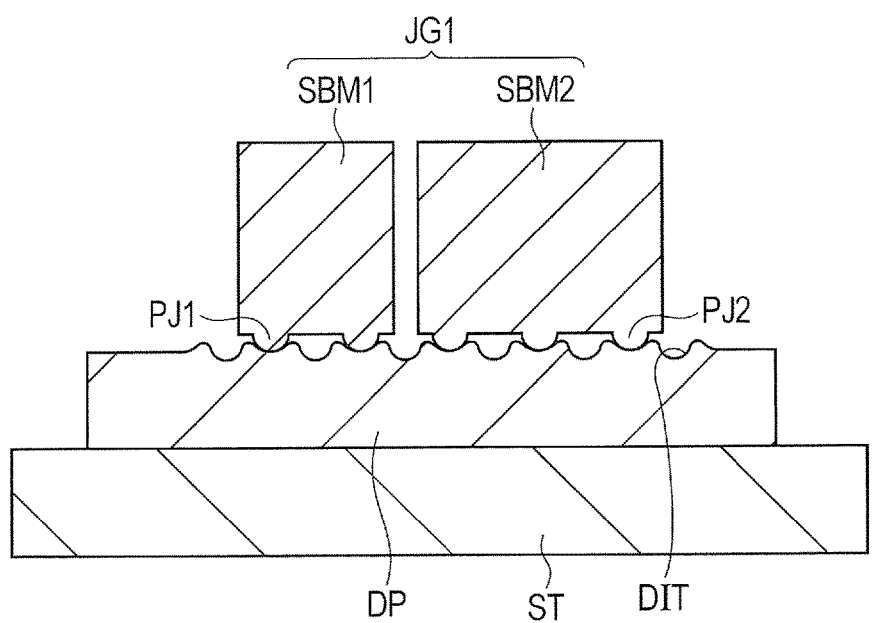
FIG. 15 is a sectional view taken along the line A-A of FIG. 14.

FIG. 15 is a sectional view taken along the line A-A of FIG. 14. As shown in FIG. 15, the die pad DP is placed on the stage ST and a plurality of ditches DIT are made on the front surface (upper surface) of the die pad DP. For example, as shown in FIG. 15, a very small concave-convex pattern is formed between adjacent ditches DIT on the front surface of the die pad DP. As shown in FIG. 15, the jig JG1 is in contact with the front surface of the die pad DP in which a plurality of ditches DIT are made. Specifically, as shown in FIG. 15, the projection PJ1 of the support portion SBM1 of the jig JG1 is in contact with the front surface of the die pad DP and the projection PJ2 of the support portion SBM2 of the jig JG1 is in contact with the front surface of the die pad DP. Particularly in this embodiment, the width (width in FIG. 15) of the projection PJ1 and the width of the projection PJ2 (width in FIG. 15) along the direction in which the third side S3 extends are smaller than the width of each of the ditches DIT and in plan view, the area of contact between the projection PJ1 and the die pad DP and the area of contact between the projection PJ2 and the die pad DP are arranged such that each of the contact areas does not overlap two or more ditches DIT in plan view.

As mentioned above, the die pad DP can be made to contact with the stage ST tightly using the jig JG1 according to this embodiment as shown in FIG. 15. In other words, the "forward inclination" of the "forwardly inclined" die pad DP is eliminated by using the jig JG1 according to this embodiment and the whole back surface of the die pad DP make tightly contact with the stage ST. Consequently, according to this embodiment, the die pad DP can be securely fixed on the stage ST by the jig JG1.

(C) Mechanism Which Fixes a "Forwardly Inclined" Die Pad Securely

Next, an explanation will be given of the mechanism (action) which securely fixes the die pad DP on the stage ST by the jig JG1 according to this embodiment as shown in FIG. 15.

Figure 16A:
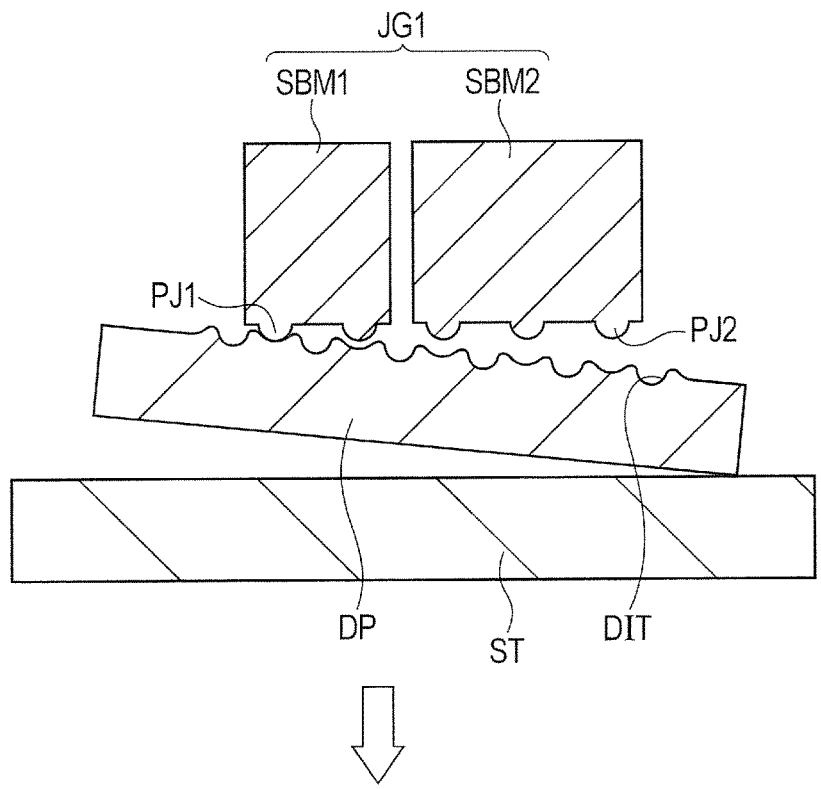
FIGS. 16A and 16B illustrate a mechanism to fix the die pad on the stage securely by the jig according to the embodiment.
Figure 16B:
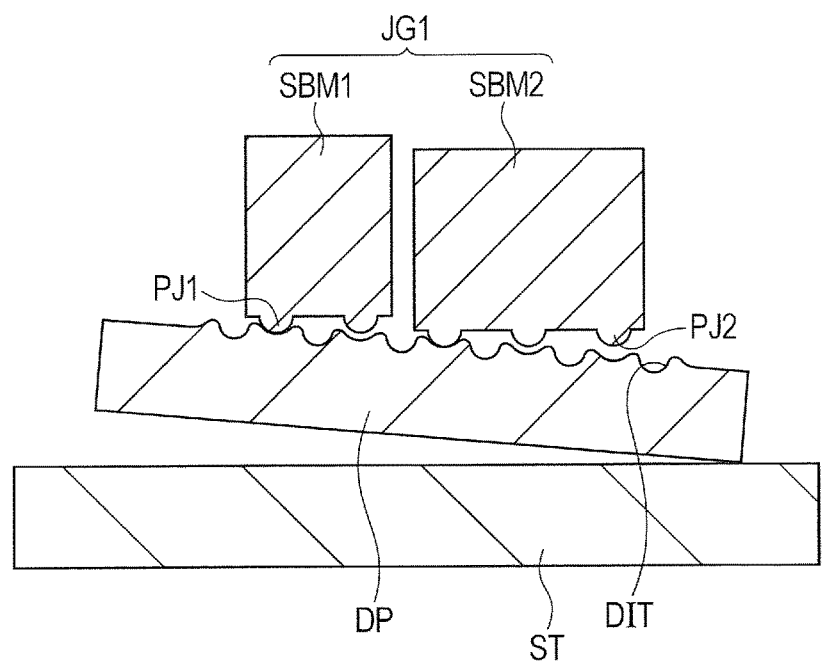

First, as shown in FIG. 16A, the jig JG1 is pressed against the "forwardly inclined" die pad DP placed on the stage ST. At this time, the projection PJ1 of the support portion SBM1 of the jig JG1 is made to contact with the front surface of the die pad DP as shown in FIG. 16A. As the jig JG1 is pressed against the die pad DP, the support portion SBM1 in contact with the die pad DP via the projection PJ1 is elastically deformed (warped). As a consequence, the projection PJ2 of the support portion SBM2 of the jig JG1 also comes to contact with the front surface of the die pad DP as shown in FIG. 16B. After that, the front surface of the die pad DP is pressed down with the projection PJ1 of the support portion SBM1 and the projection PJ2 of the support portion SBM2. Thus, the "forwardly inclined" die pad DP is pressed down using the jig JG1 according to this embodiment without causing a one-side contact. Therefore, the "forward inclination" of the die pad DP can be eliminated by using the jig JG1 according to this embodiment. This means that the whole back surface of the die pad DP is made to contact with the stage ST tightly, for example, as shown in FIG. 15. Consequently, according to this embodiment, the die pad DP can be securely fixed on the stage ST by the jig JG1.

(D) Step of Fixing the Die Pad (Summary)

As explained so far, the step of fixing the die pad DP according to this embodiment is summarized as follows. Specifically, the step of fixing the die pad DP according to this embodiment includes the following sub-steps: the step (S1) of providing a stage ST having a front surface and a jig JG1 having a support portion SBM1 and a support portion SBM2 and the step (S2) of, after the step S1, arranging a lead frame LF over the stage ST such that the back surface of the die pad DP faces the front surface of the stage ST. The step of fixing the die pad DP according to this embodiment further includes the step (S3) of, after the step S2, pressing the jig JG1 against the front surface of the die pad DP. The step S3 includes the following sub-steps: the step (S31) of making the projection PJ1 of the support portion SBM1 of the jig JG1 contact with a first point on the front surface of the die pad DP and the step (S32) of, after the step S31, making the projection PJ2 of the support portion SBM2 of the jig JG1 contact with a second point on the front surface of the die pad DP located closer to the suspension lead HL than the first point.

Particularly, in this embodiment, for example, the jig JG2 as well as the jig JG1 presses down the chip mounting area TAB of the die pad DP as shown in FIG. 14. This suggests that the step of fixing the die pad DP according to this embodiment may have the following constituent features. In the step S1, a jig JG2 having a support portion SBM3 and a support portion SBM4 is also provided and in the step S3, after the step S2, the jig JG2 is also pressed against the front surface of the die pad DP. The step of pressing the jig JG2 against the front surface of the die pad DP includes the step (S33) of making the projection (third projection) of the support portion SBM3 of the jig JG2 contact with a third point on the front surface of the die pad DP. The step of pressing the jig JG2 against the front surface of the die pad DP further includes the step (S34) of, after the step S33, making the projection (fourth projection) of the support portion SBM4 of the jig JG2 contact with a fourth point on the front surface of the die pad DP located closer to the suspension lead HL than the third point.

(E) Advantages of the Step of Fixing the Die Pad According to This Embodiment

The step of fixing the die pad DP according to this embodiment as mentioned above offers the following advantages First, the first feature of this embodiment is that the jigs JD (JG1, JD2) having the elastically deformable support portions SBM1 and SBM2 which are branched from the main body and separated from each other, for example, as shown in FIGS. 13 and 14 are used to press down the die pad DP. Due to this feature, the "forwardly inclined" die pad DP is pressed down with both the support portion SBM1 and the support portion SBM2, as shown in FIGS. 16A and 16B. This means that according to this embodiment, when the "forwardly inclined" die pad DP is pressed down with the jigs JG (JG1, JG2), "one-side (partial) contact" can be prevented. As a consequence, according to this embodiment, even in the case of a "forwardly inclined" die pad DP, its whole back surface can be in contact with the stage ST tightly, for example, as shown in FIG. 15, such that the die pad DP can be securely fixed on the stage ST by the jigs JG (JG1, JG2).

From the viewpoint of making it easier to press down the "forwardly inclined" die pad DP with both the support portion SBM1 and the support portion SBM2, it is desirable that the support portion SBM1 can be elastically deformed more easily than the support portion SBM2, for example, as shown in FIGS. 16A and 16B. The reason is that as shown in FIG. 16A, the support portion SBM1, located nearer to the tip portion of the die pad DP, first comes into contact with the "forwardly inclined" die pad DP, and then warping (elastic deformation) of the support portion SBM1 causes the support portion SBM2 to make contact with the die pad DP as shown in FIG. 16B. For this reason, in the jigs JG (JG1, JG2) according to this embodiment, the width W1 of the support portion SBM1 is smaller than the width W2 of the support portion SBM2, for example, as shown in FIG. 13. Consequently, the support portion SBM1 can warp more easily than the support portion SBM2, thereby making it easier to press down the "forwardly inclined" die pad DP with both the support portion SBM1 and the support portion SBM2. Consequently, according to this embodiment, even in the case of a "forwardly inclined" die pad DP, the whole back surface of the die pad DP can be tightly in contact with the stage ST, such that the die pad DP can be securely fixed on the stage ST by the jigs JG (JG1, JG2).

The second feature of this embodiment is that in the support portion SBM1 and the support portion SBM2 which are branched from the main body and separated from each other, the support portion SBM1 has a projection PJ1 at its tip and the support portion SBM2 has a projection PJ2 at its tip, for example, as shown in FIG. 13. This makes it possible that the projection PJ1 and the projection PJ2 contact the front surface of the "forwardly inclined" die pad DP.

In this embodiment, as shown in FIG. 13, the size (diameter) of the projection PJ1 is smaller than the width W1 of the support portion SBM1 and the size (diameter) of the projection PJ2 is smaller than the width W2 of the support portion SBM2. In the jigs JG (JG1, JG2) according to this embodiment, the projection PJ1, small in size, can make contact with the die pad DP and the projection PJ2, small in size, can make contact with the die pad DP. This means that the jigs JG (JG1, JG2) according to this embodiment can increase the pressing force applied to the die pad DP which is in contact with them. In the lead frame LF according to this embodiment, the tip portions PU of three unit structures UST arranged side by side in the x direction are connected with each other, for example, as shown in FIG. 4. For this reason, the rigidity of the lead frame LF including a plurality of unit structures UST is high. In this respect, according to the second feature of this embodiment, since the pressing force applied to the die pad DP can be increased, even the highly rigid lead frame LF can be deformed so as to eliminate the "forward inclination" of the die pad DP. In addition, in this embodiment, the width (width in FIG. 15) of the projection PJ1 and the width (width in FIG. 15) of the projection PJ2 are smaller than the distance between adjacent ditches DIT, and the area of contact between the projection PJ1 and the die pad DP and the area of contact between the projection PJ2 and the die pad DP are arranged such that each of the contact areas does not overlap two or more ditches DIT in plan view. Thus, according to this embodiment, the die pad DP can be tightly in contact with the stage ST as shown in FIG. 15. In other words, according to this embodiment, the "forward inclination" of the die pad DP is eliminated and the whole back surface of the die pad DP is made to tightly contact with the stage ST. Thus, according to this embodiment, the die pad DP can be securely fixed on the stage ST by the jigs JG (JG1, JG2). Due to the synergy of the first feature and second feature of this embodiment, even in the case of a highly rigid lead frame LF including a "forwardly inclined" die pad DP, it is easy to make the whole back surface of the die pad DP tightly contact with the stage ST, such that the die pad DP can be securely fixed on the stage ST by the jigs JG (JG1, JG2).

(F) Details of The Wire Bonding Step (Source Wire)

In this embodiment, after the die pad DP is securely fixed on the stage ST by the jigs JG (JG1, JG2) as mentioned above, a semiconductor chip CHP and a lead (source lead SL) are electrically connected via an aluminum wire (conductive member). Specifically, in this embodiment, while pressing the jigs JG (JG1, JG2) against the front surface of the die pad DP, the aluminum wire (conductive member) is connected with the semiconductor chip CHP.

FIGS. 17A to 17E are views explaining details of the wire bonding step in this embodiment. First, as shown in FIG. 17A, a semiconductor chip CHP is mounted over the front surface of the die pad DP placed on the stage ST. The aluminum wire (source wire SW) drawn from a bonding tool having a wedge tool WT, a wire guide WG, and a wire cutter WC is bonded at a first joint A1 on a source pad of the semiconductor chip CHP. At this time, for example, ultrasonic waves are applied to the area of contact between the semiconductor chip CHP and the aluminum wire (source wire SW). In other words, in this embodiment, the aluminum wire (source wire SW) drawn from the bonding tool is bonded to the first joint A1 on the source pad of the semiconductor chip CHP by applying ultrasonic waves to the area of contact between the semiconductor chip CHP and the aluminum wire (source wire SW). After that, as shown in FIG. 17B, the bonding tool is moved and the aluminum wire (source wire SW) is bonded to a second joint A2 on the source pad of the semiconductor chip CHP by applying ultrasonic waves to the area of contact between the semiconductor chip CHP and the aluminum wire (source wire SW). Then, as shown in FIG. 17C, the bonding tool is moved onto the source lead SL (lead LD) and the aluminum wire (source wire SW) drawn from the bonding tool is bonded to the source lead SL by applying ultrasonic waves to the area of contact between the semiconductor chip CHP and the aluminum wire (source wire SW). The source pad over the semiconductor chip CHP and the source lead SL are thus connected by the aluminum wire (source wire SW). Then, the aluminum wire is cut by the wire cutter WC as shown in FIG. 17D and then the bonding tool is moved away from the stage ST as shown in FIG. 17E. In this embodiment, the wire bonding step is performed as mentioned above.

According to this embodiment, with the die pad DP securely fixed on the stage ST by the jigs JG (JG1, JG2), the semiconductor chip CHP and the source lead SL (lead LD) are electrically connected via the source wire SW (aluminum wire). Consequently, according to this embodiment, the reliability in connection between the semiconductor chip CHP (source pad) and the source wire SW (aluminum wire)

can be enhanced. In short, according to this embodiment, a bonding failure as typified by wire peeling can be suppressed. The reason for this is that in the wire bonding step according to this embodiment, the die pad DP is fixed using the jigs JG (JG1, JG2) and thus the whole back surface of the die pad DP can be in tightly contact with the stage ST so as to eliminate the "forward inclination" of the die pad DP, thereby making it possible that the die pad DP is securely fixed on the stage ST by the jigs JG (JG1, JG2). Specifically, according to this embodiment, since the die pad DP is securely fixed on the stage ST by the jigs JG (JG1, JG2), the die pad DP is prevented from being unstable, for example, when making the bonding tool contact with the semiconductor chip CHP, thereby enhancing the reliability in connection between the semiconductor chip CHP (source pad) and the source wire SW (aluminumwire). Furthermore, if ultrasonic waves are used in the wire bonding step, since the die pad DP is securely fixed on the stage ST by the jigs JG (JG1, JG2), dispersion (diffusion) of ultrasonic waves is suppressed, which also contributes to enhancement of the reliability in connection between the semiconductor chip CHP (source pad) and the source wire SW (aluminumwire). In sum, when ultrasonic waves are used in the wire bonding step, the prevention of unstableness of the die pad DP and the suppression of dispersion (diffusion) of ultrasonic waves can synergistically reduce failures in bonding between the semiconductor chip CHP (source pad) and the source wire SW (aluminum wire).

(G) Other Advantages of the Wire Bonding Step in This Embodiment

Figure 18:
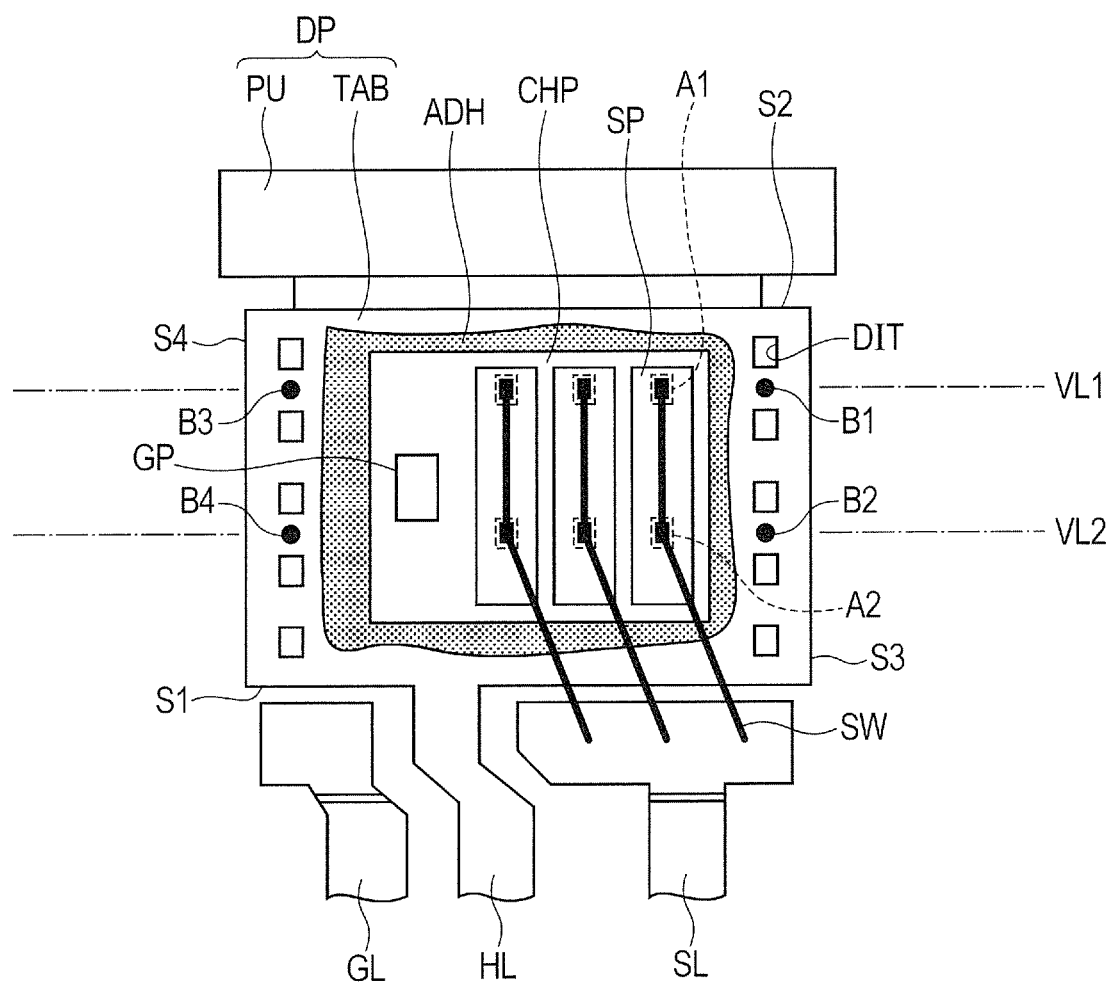
FIG. 18 schematically shows that the semiconductor chip and the source lead are electrically connected via a source wire.

Next, another advantage of the wire bonding step in this embodiment will be described. FIG. 18 schematically shows that the semiconductor chip CHP and the source lead SL are electrically connected via the source wire SW (aluminumwire). FIG. 18 indicates the first joint A1 between the source pad SP over the semiconductor chip CHP and the source wire SW and the second joint A2 between the source pad SP over the semiconductor chip CHP and the source wire SW. FIG. 18 also indicates a first point B1 as a point of contact between the projection (PJ1) of the support portion (SBM1) of the jig (JG1) and the chip mounting area TAB and a second point B1 as a point of contact between the projection (PJ2) of the support portion (SBM2) of the jig (JG1) and the chip mounting area TAB, though the jig (JG1) and the jig (JG2) which fix the chip mounting area TAB are not shown. Similarly, FIG. 18 also indicates a third point B3 as a point of contact between the projection (third projection) of the support portion (SBM3) of the jig (JG2) and the chip mounting area TAB and a fourth point B4 as a point of contact between the projection (fourth projection) of the support portion (SBM4) of the jig (JG2) and the chip mounting area TAB.

The third feature of this embodiment is that the first point B1 of the front surface of the chip mounting area TAB and the second point B2 of the front surface of the chip mounting area TAB are both not on the tip portion PU of the die pad DP and are closer to the third side S3 of the chip mounting area TAB than to the second side S2, for example, as shown in FIG. 18. Particularly, in this embodiment, the first point B1 and the second point B2 are located along the third side S3. Consequently, according to this embodiment, the first point B1 and the second point B2 are closer to the semiconductor chip CHP than when the first point B1 and the second point B2 are on the tip portion PU. According to this embodiment, this means that the first point B1 and the second point B2 are closer to the first joint A1 and the second joint A2. This also means that the points at which the chip mounting area TAB is fixed by the jigs JG (JG1, JG2) are closer to the points of contact between the semiconductor chip CHP and the source wire SW, which effectively prevents the die pad DP from being unstable when making the bonding tool contact with the semiconductor chip CHP. Therefore, according to the third feature of this embodiment, the reliability in connection between the semiconductor chip CHP (source pad SP) and the source wire SW (aluminum wire) can be further enhanced.

This embodiment assumes that the semiconductor chip CHP (source pad SP) and the source wire SW (conductive member) are bonded together at the first joint A1 and second joint A2 which are different from each other, for example, as shown in FIG. 18. Based on this assumption, the fourth feature of this embodiment is that the first joint A1 lies on a first virtual line VL1 connecting the first point B1 and the third point B3 in plan view and the second joint A2 lies on a second virtual line VL2 connecting the second point B2 and the fourth point B4 in plan view, for example, as shown in FIG. 18. Consequently, according to the fourth feature of this embodiment, when making the bonding tool contact with the semiconductor chip CHP, the unstableness of the die pad DP can be prevented effectively. Consequently, according to the fourth feature of this embodiment, the reliability in connection between the semiconductor chip CHP (source pad SP) and the source wire SW (aluminum wire) can be further enhanced.

<<<Variation>>>

This embodiment has been described so far on the assumption that the source pad SP over the semiconductor chip CHP and the source wire SW are bonded at two joints (first joint A1 and second joint A2), for example, as shown in FIG. 18. However, the technical idea of this embodiment is not limited thereto and it may be applied to an example that the source pad SP over the semiconductor chip CHP and the source wire SW are bonded at one joint (first joint A1), for example, as shown in FIG. 19.

Figure 19:
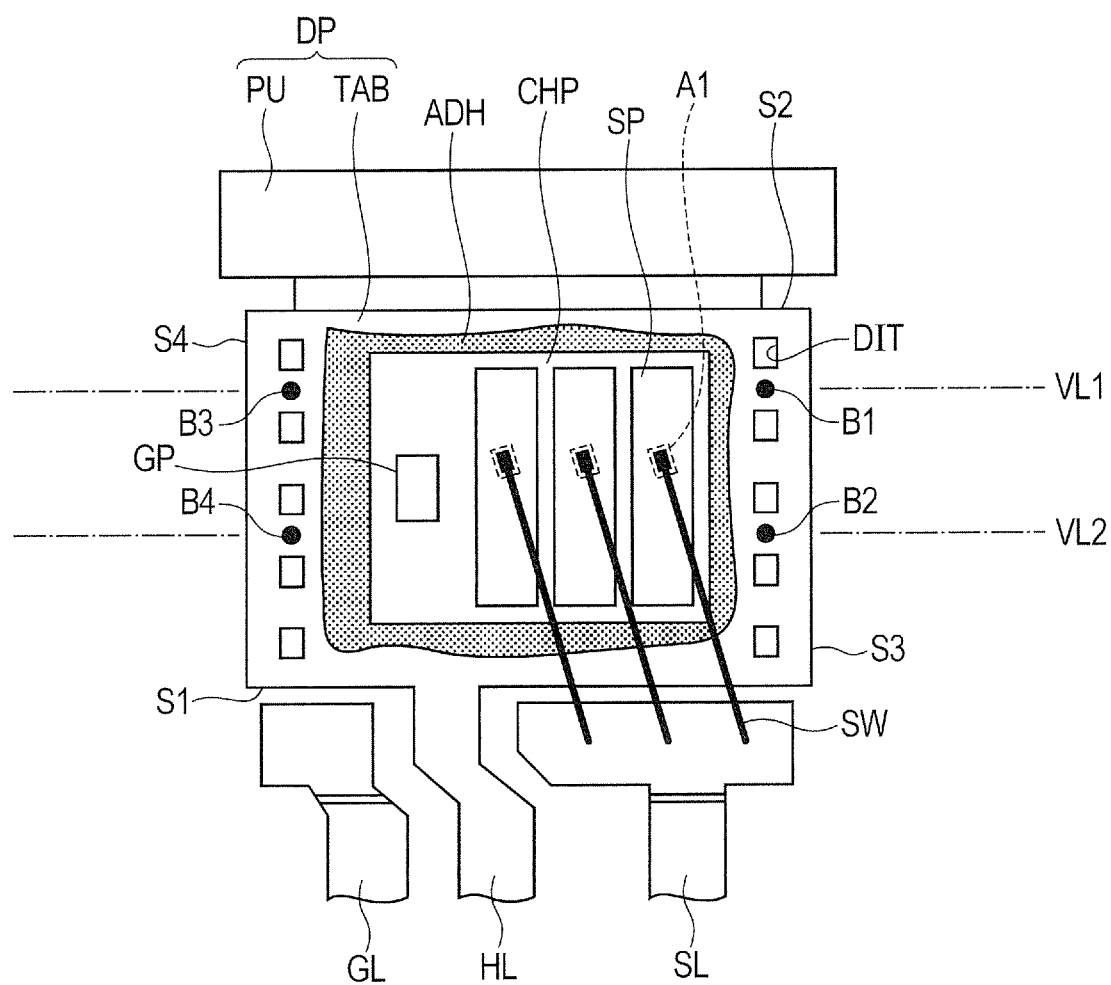
FIG. 19 is a schematic view of a variation of the embodiment, showing that the semiconductor chip and the source lead are electrically connected via the source wire.

FIG. 19 is a schematic view of a variation of the embodiment, showing that the semiconductor chip CHP and the source lead SL are electrically connected via the source wire SW (aluminum wire). As shown in FIG. 19, in plan view, the joint (first joint A1) lies, for example, in the region between the virtual line VL1 connecting the first point B1 and the third point B3 and the second virtual line VL2 connecting the second point B2 and the fourth point B4. In this case as well, the die pad DP is effectively prevented from being unstable when making the bonding tool contact with the semiconductor chip CHP. Consequently, in this variation as well, the reliability in connection between the semiconductor chip CHP (source pad SP) and the source wire SW (aluminum wire) can be enhanced.

(H) Wire Bonding Step (Gate Wire)

As mentioned above, in this embodiment, after the die pad DP is securely fixed on the stage ST by the jigs JG (JG1, JG2), the semiconductor chip CHP and the lead (source lead SL) are electrically connected via the aluminum wire (conductive member). Then, in this embodiment, while the die pad DP is kept securely fixed on the stage ST by the jigs JG (JG1, JG2), the semiconductor chip CHP and the gate lead GL are electrically connected via a gate wire GW as an aluminum wire (conductive member) as shown in FIGS. 20A and 20B. Here, the diameter of the gate wire GW is smaller than the diameter of the source wire SW. This is because the current which flows in the gate wire GW is smaller than the current which flows in the source wire SW. The wire bonding step is performed as mentioned above in this embodiment.

<<<Variation>>>

The wire bonding step in this embodiment has been described above on the assumption that after the source wire SW is connected with the source pad SP of the semiconductor chip CHP, the gate wire GW is connected with the gate pad GP of the semiconductor chip CHP. However, the technical idea of this embodiment is not limited thereto. For example, it may be applied to an example that after the gate wire GW is connected with the gate pad GP of the semiconductor chip CHP, the source wire SW is connected with the source pad SP of the semiconductor chip CHP.

4. Molding Step (Sealing Step)

Next, the semiconductor chip CHP is sealed by a sealing body MR of resin as shown in FIGS. 21A and 21B. The sealing body MR seals the chip mounting area TAB, source wire SW, gate wire GW and parts of the leads LD. At this time, as shown in FIGS. 20A and 20B, since the chip mounting area TAB has a plurality of ditches DIT, an anchor effect attributable to the ditches DIT increases the strength of adhesion between the chip mounting area TAB and the sealing body MR.

In the molding step, the resin injection pressure is applied to the source wire SW and the gate wire GW, but in this embodiment, the strength of bonding between the source wire SW and the source pad SP and the strength of bonding between the gate wire GW and the gate pad GP are increased because in the wire bonding step, ingenuity as mentioned above is exercised, such that the possibility of wire peeling is reduced. As a consequence, the semiconductor device manufacturing method according to this embodiment brings about the following striking effects: enhancement of the reliability of the semiconductor device and improvement in semiconductor device manufacturing yield.

5. External Plating Step

Figure 22:
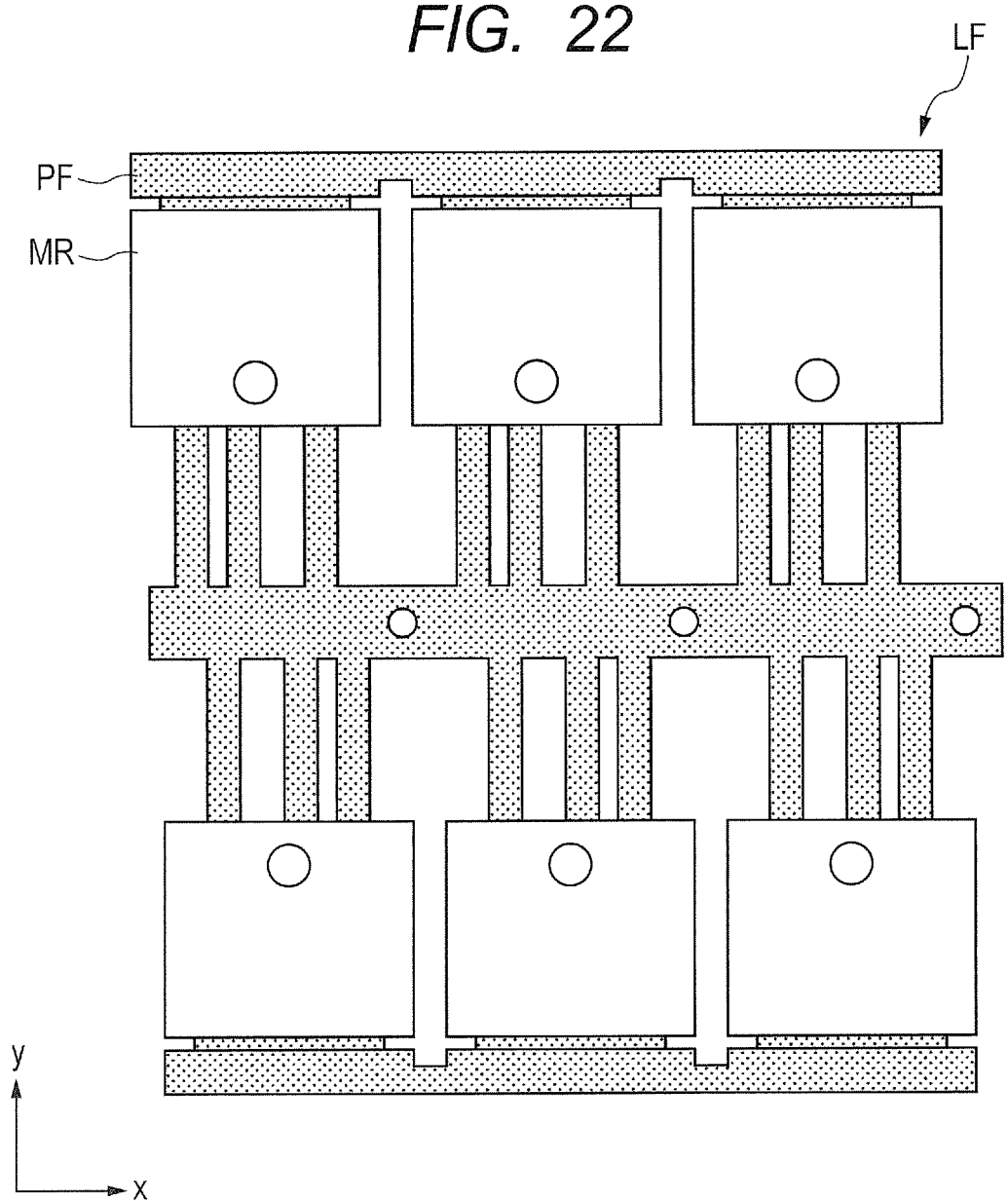
FIG. 22 is a plan view showing the semiconductor device manufacturing process according to the embodiment.

After that, a plating film PF as a conductor film is formed on the surfaces of parts of the leads LD exposed from the sealing body MR, as shown in FIG. 22.

6. Marking Step

Next, information (mark) including the product name and model number is provided on the surface of the resin sealing body MR, though not shown. The mark may be made by using a printing technique or irradiating the sealing body surface with laser.

7. Individualization Step

Figure 23:
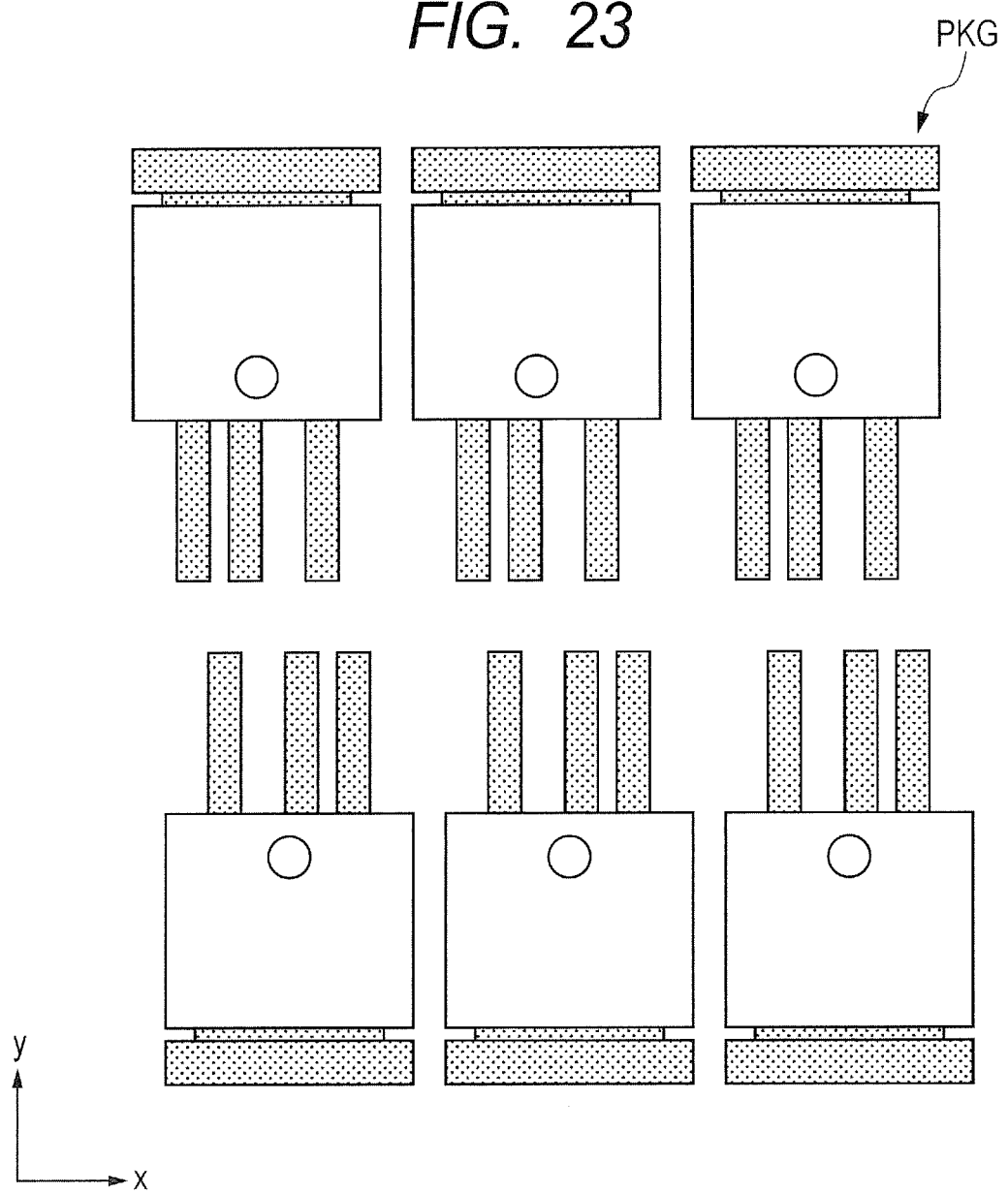
FIG. 23 is a plan view showing the semiconductor device manufacturing process according to the embodiment.

After that, as shown in FIG. 23, a plurality of semiconductor devices PKG are individualized by cutting the leads LD to separate them from the lead frame LF. Subsequently, for example, a testing step including an electrical characteristic test and an appearance test is carried out and semiconductor devices PKG judged as non-defective products are packed and shipped. The semiconductor device PKG is thus manufactured according to this embodiment.

The invention made by the present inventors has been so far explained concretely in reference to the above embodiment thereof. However, the invention is not limited thereto and it is obvious that these details may be modified in various ways without departing from the gist thereof.

The variations of the above embodiment which have been described above may be combined without departing from the gist of the technical idea of the above embodiment.

The technical idea embodied by the jig according to the above embodiment is effective particularly in fixing a "forwardly inclined" die pad on the stage securely. However, the jig embodying the technical idea of the above embodiment can be used not only to securely fix a forwardly inclined" die pad on the stage but also to securely fix a die pad which is not "forwardly inclined", on the stage. In other words, the jig embodying the technical idea of the above embodiment may be applied not only to the case of securely fixing a "forwardly inclined" die pad on the stage but it may be applied to a wider range of cases including the case of securely fixing a die pad which is not "forwardly inclined" on the stage.

Therefore, the jig embodying the technical idea of the above embodiment is versatile and thus provides high usability. In other words, the technical idea of the above embodiment which is embodied by the jig is an excellent technical idea because it not only contributes to enhancement of the reliability of the wire bonding step by securely fixing a "forwardly inclined" die pad on the stage, but also offers a versatile jig.

The above embodiment includes the mode described below.

(Note)

A jig for fixing a die pad placed on a stage, the jig including:
a first support portion which is elastically deformable;
a second support portion which is separated from the first support portion by a slit and elastically deformable;
a first convex part which is provided on the first support portion and can be in contact with the die pad; and
a second convex part which is provided on the second support portion and can be in contact with the die pad, in which
the length of the slit is larger than the distance between the first support portion and the second support portion.

What is claimed is:

1. A method of manufacturing a semiconductor device, comprising the steps of:
   (a) providing a lead frame having a lead, a die pad, and a suspension lead connected to the die pad and bent along a thickness direction of the die pad;
   (b) after the step (a), mounting a semiconductor chip on a first surface of the die pad; and
   (c) after the step (b), electrically connecting the semiconductor chip with the lead via a conductive member,
   wherein the step (c) comprises the steps of:
      (c1) providing a stage having a front surface, and a first jig having a first support portion and a second support portion;
      (c2) after the step (c1), arranging the lead frame over the stage such that a second surface of the die pad, opposite to the first surface, faces the front surface of the stage;
      (c3) after the step (c2), pressing the first jig against the first surface of the die pad; and
      (c4) after the step (c3), connecting the conductive member with the semiconductor chip, while pressing the first jig against the first surface of the die pad, and
   wherein the step (c3) comprises the steps of:
      (c31) making a first convex part of the first support portion of the first jig contact with a first point on the first surface of the die pad; and
      (c32) after the step (c31), making a second convex part of the second support portion of the first jig contact with a second point on the first surface of the die pad located closer to the suspension lead than the first point.

2. The method according to claim 1,
wherein the die pad in the lead frame provided in the step (a), comprises:
   a chip mounting area on which the semiconductor chip is mounted; and
   a tip portion connected with the chip mounting area, and wherein the die pad is inclined toward a direction in which the tip portion becomes closer to the lead in sectional view.

3. The method according to claim 1,
wherein a second jig having a third support portion and a fourth support portion is provided in the step (c1), and
wherein the step (c3) further comprises the step of pressing the second jig against the first surface of the die pad after the step (c2),
wherein the step of pressing the second jig against the first surface of the die pad comprises the steps of:
(c33) making a third convex part of the third support portion of the second jig contact with a third point on the first surface of the die pad; and
(c34) after the step (c33), making a fourth convex part of the fourth support portion of the second jig contact with a fourth point on the first surface of the die pad located closer to the suspension lead than the third point, and
wherein in the step (c4), after the step (c3), the conductive member is connected with the semiconductor chip, while pressing the second jig against the first surface of the die pad.

4. The method according to claim 3,
wherein the conductive member is bonded to a first joint of the semiconductor chip and a second joint of the semiconductor chip which is different from the first joint,
wherein the first joint lies on a first virtual line connecting the first point and the third point in plan view, and
wherein the second joint lies on a second virtual line connecting the second point and the fourth point in plan view.

5. The method according to claim 3,
wherein the conductive member is bonded to a joint of the semiconductor chip, and
wherein the joint lies in a region between a first virtual line connecting the first point and the third point and a second virtual line connecting the second point and the fourth point.

6. The method according to claim 1,
wherein the die pad comprises:
a first side to be connected with the suspension lead;
a second side parallel to the first side; and
a third side crossing the first side and the second side, and
wherein the first point on the first surface of the die pad and the second point on the first surface of the die pad are both closer to the third side than to the second side.

7. The method according to claim 6, wherein the first point and the second point are located along the third side.

8. The method according to claim 1,
wherein a plurality of unit structures each including the lead, the die pad having a tip portion, and the suspension lead are formed in the lead frame provided in the step (a),
wherein some of the unit structures are arranged side by side in a first direction crossing a direction in which the suspension lead extends, and
wherein the tip portions of the die pads included in the unit structures arranged side by side in the first direction among the unit structures are connected with each other.

9. The method according to claim 1, wherein in the step (c), ultrasonic waves are applied to an area of contact between the semiconductor chip and a conductive member.

10. The method according to claim 1,
wherein a slit for separating the first support portion and the second support portion is made in the first jig provided in the step (c1), and
wherein length of the slit is larger than distance between the first support portion and the second support portion in a direction crossing the slit.

11. The method according to claim 10, wherein a first width of the first support portion in the direction crossing the slit is smaller than a second width of the second support portion in the direction crossing the slit.

12. The method according to claim 10, wherein a first width of the first support portion in the direction crossing the slit is equal to a second width of the second support portion in the direction crossing the slit.

13. The method according to claim 8, wherein in the step (b), while among the unit structures arranged side by side in the first direction, unit structures except a first unit structure on which the semiconductor chip is to be mounted are covered by a cover, the semiconductor chip is mounted over the die pad of the first unit structure.

14. The method according to claim 13, wherein in the step (b), a die bonding jig is pressed against a tip portion of the die pad of the first unit structure.

15. The method according to claim 1, further comprising the step of:
after the step (c), sealing the semiconductor chip and the conductive member,
wherein the die pad in the lead frame provided in the step (a), comprises:
a first side to be connected with the suspension lead;
a second side parallel to the first side; and
a third side crossing the first side and the second side, and
wherein the die pad has a plurality of ditches arranged along the third side.

16. The method according to claim 15,
wherein width of the first convex part and width of the second convex part along a direction in which the third side extends are smaller than distance between adjacent ditches among the ditches, and
wherein each of the first point and the second point does not overlap two or more of the ditches in plan view.

17. The method according to claim 1, wherein a power transistor is formed in the semiconductor chip.

18. The method according to claim 17,
wherein the semiconductor chip comprises:
a main surface; and
a back surface opposite to the main surface,
wherein a first main surface electrode and a second main surface electrode larger in external size than the first main surface electrode are formed on the main surface of the semiconductor chip, and
wherein a back electrode is formed on the back surface of the semiconductor chip.

19. The method according to claim 1, wherein the conductive member is a wire or a ribbon.

20. The method according to claim 1, wherein the conductive member is mainly comprised of aluminum.

* * * * *